(12) United States Patent
Nieminen et al.

(10) Patent No.: US 6,557,413 B2
(45) Date of Patent: May 6, 2003

(54) MICROMECHANICAL STRUCTURE

(75) Inventors: Heikki Nieminen, Espoo (FI); Tapani Ryhänen, Helsinki (FI); Vladimir Ermolov, Helsinki (FI); Samuli Silanto, Helsinki (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/967,429

(22) Filed: Sep. 28, 2001

(65) Prior Publication Data

US 2002/0108442 A1 Aug. 15, 2002

(30) Foreign Application Priority Data

Oct. 2, 2002 (FI) .............................. 20002173

(51) Int. Cl.[7] .............................. G01P 15/00
(52) U.S. Cl. ........................ 73/488; 310/311
(58) Field of Search .............. 73/504.02, 504.03, 73/504.04, 504.12, 504.15, 504.16, 514.16, 514, 32, 514.34, 488, 514.01, 514.12, 649, 652, 570; 310/311, 329

(56) References Cited

U.S. PATENT DOCUMENTS

| | | | |
|---|---|---|---|
| 5,344,117 A | 9/1994 | Trah et al. ..................... | 251/11 |
| 5,756,901 A | 5/1998 | Kurle et al. .................. | 73/777 |
| 6,000,280 A | * 12/1999 | Miller et al. .................. | 73/105 |
| 6,073,484 A | * 6/2000 | Miller et al. .................. | 73/105 |
| 6,369,931 B1 | * 4/2002 | Funk et al. .................. | 359/223 |

FOREIGN PATENT DOCUMENTS

EP 0986077 A2 3/2000
WO WO 00/50337 8/2000

OTHER PUBLICATIONS

A Micromachine–Based Low Phase–Noise GHz Voltage–Controlled Oscillator for Wireless Communications; Darrin J. Young, Joo L. Tham, BernhardtE. Boser; 4 pages.
Micromachined Devices for Wireless Communications; Clark T.–C. Nguyen, Linda P. B. Katehi, Gabriel M. Rebeiz; Aug. 1998; p. 1756–p. 1768.
Elimination of Extra Spring Effect at the Sep–Up Anchor of Surface–Micromachined Structure; John Jung–Yeul Gill, Lan V. Ngo, Phyliss R. Nelson, Chang–Jin "CJ" Kim; Mar. 1998; p. 114–p. 121.

* cited by examiner

Primary Examiner—Richard A. Moller
(74) Attorney, Agent, or Firm—Perman & Green, LLP

(57) ABSTRACT

The invention relates to a micromechanical structures that include movable elements. In particular the invention relates to an arrangement for coupling such movable elements to other structures of a microelectromechanical system (MEMS). The invention is characterized in that the arrangement comprises at least one coupling means (930–936) for coupling the movable element to the fixed structure, and at least one flexible means (980, 990–996) for allowing different thermal expansion between the movable element and the other structure in the direction which is substantially perpendicular to the characteristic movement of the movable element, wherein said coupling means and/or flexible means is reinforced in the direction of the characteristic movement of the movable element.

16 Claims, 23 Drawing Sheets

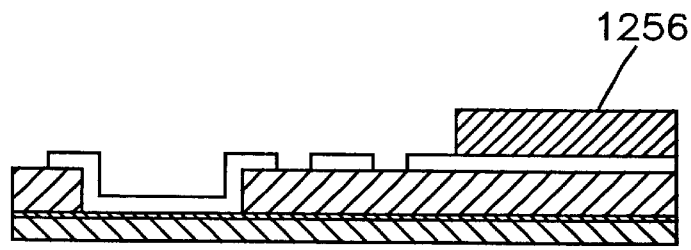
☐ 1st METAL ▨ SEED LAYER ▨ 1st POLYMER LAYER ▨ SUBSTRATE
▨ 2nd POLYMER LAYER
STEP 1250; DEPOSITING A SECOND POLYMER LAYER
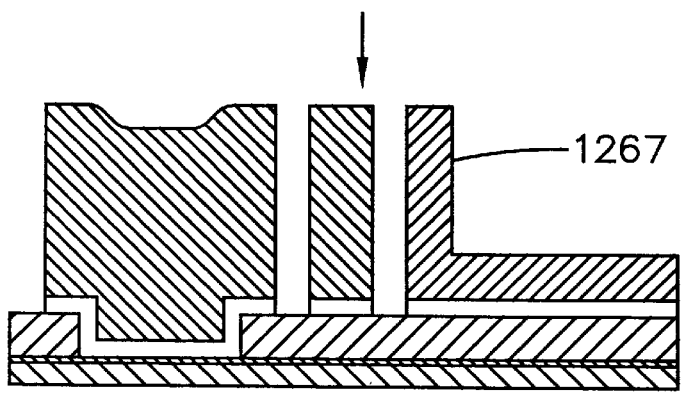
☐ 1st METAL ▨ SEED LAYER ▨ POLYMER LAYER ▨ SUBSTRATE
▨ 2nd METAL ▨ 2nd POLYMER LAYER
STEP 1260; SECOND ELECTROPLATING
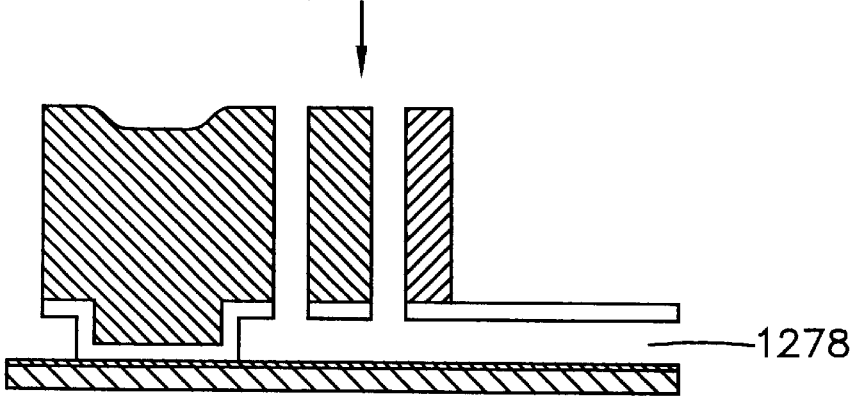
☐ 1st METAL ▨ SEED LAYER ▨ POLYMER LAYER ▨ SUBSTRATE
▨ 2nd METAL
STEP 1270; ETCHING AWAY SACRIFICAL POLYMER
FIG. 12B

MICROMECHANICAL STRUCTURE

TECHNICAL FIELD OF THE INVENTION

The invention relates to a micromechanical structures that include movable elements. In particular the invention relates to an arrangement for coupling such movable elements to other structures of a microelectromechanical system (MEMS).

BACKGROUND ART OF THE INVENTION

In microelectronics the trend has been towards a higher level of integration. The same applies to micromechanics as well. Consequently, micromechanical elements designated especially for microelectronic purposes need to be more highly integrated because of the requirement for smaller and smaller components for electrical applications.

Prior art micromechanical components have been optimized for low frequency (<1 MHz) applications and used mainly for inertial and pressure sensors. The design of micromechanical RF components for 1 to 5 GHz applications used in mobile terminals sets demands on micromachined structures. These demands are partly different from the problems in the low frequency Micro Electromechanical Systems (MEMS) applications.

The optimization of the capacitive micromechanical structures is subject to several parameters:
  Sensitivity to the measured value or control force (e.g., acceleration to capacitance transfer function, control voltage to capacitance transfer function),
  Signal to noise ratio that depends on the several other device parameters,
  Zero point stability of the device with respect to long time periods and temperature.

These optimization criteria convert into more specific device requirements when the application and especially the measurement or operation frequency is taken into account. This invention is related to the use of the micromechanical structure as a part of the high frequency application. Two different examples of such an application are:
  MEMS rf components: tunable capacitors and micromechanical microrelays;
  Micromechanical low noise, high sensitivity accelerometer using LC resonance as a basis of the measurement electronics;

For both these applications, there are several common requirements for the device:
  Series resistance of the device must be minimized;
  Series (stray) inductance of the device must minimized and repeatable;
  Temperature dependence of the structure must be as small as possible; and
  Parasitic capacitance must be minimized.

The prior art micromechanical structures are mostly based on silicon and polysilicon structures. The polysilicon has good mechanical properties and technology to build suspended structures from it is well researched. However, the main disadvantage of these structures is the high series resistance. The series resistance reduces the Q value of the component at high frequencies.

Many devices like the low-noise rf voltage controlled oscillators (VCO) require a resonant device with high Q-factor, since the phase noise of an oscillator is proportional to $1Q_T^2$, where $Q_T$ is the overall Q-factor of the resonator. High dynamic range filters also require a high Q-resonator, since the dynamic range of the filter is proportional to $Q_T^2$. The quality factor within the frequency range 1 to 2 GHz is dominated by the series resistance. Previously, for instance the MEMS tunable capacitors were fabricated from the polysilicon, but the requirement for the low series resistance has forced to consider metal as the material of the structure. Metal can be for instance gold, copper, silver, nickel, aluminum, chromium, refractory metal or alloy of several metals.

In capacitive sensors the ultimate resolution of the capacitance measurement is limited by the series and/or parallel resistances of the sensing capacitance. Most of the prior art capacitive inertial sensors are made of doped monocrystalline or polycrystalline silicon, and the conductivity is limited to relatively modest values. Furthermore, the additional series resistance due to metal/silicon interfaces increases the series resistance. The inertial sensors based on metal structures have been studied, [1] and [2], because of two clear advantages: 1) metals have higher material density that increases the mass and thus the sensitivity of the capacitive sensor, and 2) metals have higher electrical conductivity that reduces the electrical noise of the capacitive sensor. One of the key problem in using metallic materials for inertial sensors has been the elimination of thermal stress caused by the mismatch of the thermal expansion coefficients between the substrate and the structure.

Metal thus has some disadvantageous characteristics like the built-in stress that can cause warping of the suspended structures. In addition, most metals that are available in the MEMS processes have the thermal expansion coefficient that is very different compared to the thermal expansion coefficient of most substrate materials such as silicon, quartz or borosilicate glass. Thermal stress of the suspended structure, due to the thermal expansion mismatch, can cause severe thermal dependence in the device.

FIG. 1 shows a typical micromechanical bridge. The requirement is to make a mechanically ideal anchor using a minimum of process steps. A simple process is advantageous in the method shown in FIG. 1. One disadvantage of such metal structure is that the built-in stress and any temperature dependent stress tend to bend the suspended structure.

FIG. 1 illustrates the situation when the micromechanical metal structure with a movable element 110 and anchors 130, 132 is deposited on top of the silicon substrate 150. The FIG. 1 also shows the insulating layer 160 and the fixed electrodes 140, 142 on the substrate. The change of the internal stress of the metal 110 due to the change in temperature can be calculated as $$\Delta\sigma = E \cdot (\alpha_2 - \alpha_1) \cdot \Delta T \qquad (1)$$

where E is the Young's modulus, $\alpha_1$, and $\alpha_2$ are the thermal expansion coefficients of the metal film and the silicon substrate, respectively, and $\Delta T$ is the temperature change.

For the copper film on top of the silicon substrate, $$\frac{\partial \sigma}{\partial T} = 2 \frac{MPa}{°C}. \qquad (2)$$

The stress in the metal causes a force $F_{\mathit{eff}}$ to the anchoring structures 130 and 132.

FIG. 2 shows the moment effect at the step-up anchor structure. We suppose that the suspended structure is connected to the substrate from several points and that the thermal expansion mismatch between the substrate and the suspended structure causes strain in the suspended structure.

Effect of the strain is shown as two arrows in FIG. 2. Figure shows how the moment caused by the step-up anchor bends (exaggerated) the suspended structure. Normal dimensions for the suspended structure might be for instance that the suspended structure is 500 μm long, 1 μm thick and it is 1 μm above the substrate. Even a very small bending moment would be catastrophic, since the structure would touch the surface.

FIG. 3 shows how the control voltage is dependent on the residual stress of a copper film double supported beam. The capacitance is kept constant, in this case 0.9 pF. Length of the beam is 0,5 mm, width is 0,2 mm, and thickness is 0.5 μm. The gap between the control electrode and the beam is 1 μm. The Figure shows how sensitive the control voltage is to low level residual film stress.

The temperature dependence of the capacitance can be calculated as $$\frac{\partial C}{\partial T} = \frac{\partial C}{\partial \sigma} = \frac{\partial \sigma}{\partial T} \qquad (3)$$

The temperature dependence increases with the control voltage. For example, for 5 MPa residual stress, the temperature dependence of the capacitance can be 1%/° C. at 1 V control voltage, and 24%/° C. at 3 V control voltage. If the device is operated at low control voltages, the residual stress of the film must be minimized. At this range, the temperature dependence must be minimized by some structural modifications.

The temperature dependence has been reduced by using flexible spring support for the structure. Such prior art solutions for implementing micromechanical components are described e.g. in documents [3]–[6]. However, the problem of these prior art devices is: 1) too high series resistance, 2) too high temperature dependence, 3) too high stray inductance.

Prior art micromechanical structures comprising movable elements have therefore disadvantages related to the requirements described above. The prior art structures suffer from temperature dependence, due to the mismatch of thermal expansion coefficients of the micromechanical structure and the substrate. Series resistance and parasitic capacitance are also high in prior art RF components such as tunable capacitors and resonators based on a tunable micromechanical capacitor and an integrated inductor. These factors may lead to high losses, thermal unstability and unreliability of the micromechanical components.

SUMMARY OF THE INVENTION

The purpose of the invention is to achieve improvements related to the aforementioned disadvantages. The invented arrangements for coupling a movable element to other micromechanical structures facilitates minimizing the temperature dependence, the series resistance, the stray inductance and the parasitic capacitance. Hence, the invention presents a substantial improvement to the stability and reliability of the micromechanical componets, especially in the RF applications.

An arrangement according to the invention for coupling a movable element, which has a characteristic movement direction, to a fixed structure, such as substrate, of a micromechanical component, is characterized in that the arrangement comprises at least one coupling means for coupling the movable element to the fixed structure, and at least one flexible means for allowing different thermal expansion between the movable element and the other structure in a direction which is substantially perpendicular to the characteristic movement of the movable element, wherein said coupling means and/or flexible means is reinforced to be substantially inflexible in the direction of the characteristic movement of the movable element.

The invention also relates to a micromechanical component wich comprises an arrangement described above.

Preferred embodiments of the invention are described in the dependent claims.

One idea in implementing this invention is to use an additional layer, such as a metal layer, to form boundary conditions that are as close to ideal as possible for suspended structures. The inventive concept can most advantageously be realised using one or several of the following details:

1) The deflecting metal thin film is mechanically decoupled from the substrate and consists of:
   a) Membrane, diaphgram or thin metal film of any shape,
   b) Surrounding frame that can be of any shape as long as it is symmetric about the axes formed by two opposing anchors,
   c) Inner springs that connect the deflecting element to the frame are formed on the corners of the frame,
   d) Anchoring of the frame to the substrate at the middle of the frame forming beams,
   e) Optional outer beams that further connect the frame and the substrate anchoring. The structure is further characterized by the symmetry shown in FIG. 9A (described in more detail in the following part of the specification), and
   f) Anchoring of the frame to the substrate is arranged to be temperature compensated.

Mechanical decoupling of the movable element achieved by the structure is almost perfect. Disadvantage of the planar structure of this preferred embodiment is, however, that the corners of the frame may warp in the direction perpendicular to the substrate plane (in vertical direction) due to the built-in (residual) stress in the frame or moving element.

2) Eliminating of the warping of the structure by having larger vertical thickness for the frame than for the moving element. Another possibility to achieve a rigid vertical structure is to use profile geometries.

The invention can be implemented utilizing new fabrication technologies that are commonly known as micro system technologies (MST) or Micro Electromechanical Systems (MEMS). These fabrication technologies enable the fabrication of movable structures on top of the silicon wafer or any other substrate material. The preferred process is based on the deposition of a sacrificial material layer (silicon dioxide or polymer film) under the movable structure during the fabrication. During the final steps of fabrication the movable mechanical structure is released by etching the sacrificial layer away.

Invention improves the prior art devices (metal film structures on top of silicon substrate) in several ways:

Thermally induced stress of the deflecting thin film is minimized, below 0.5 MPa level, because of the geometrical symmetries;

Series resistance is low, below 0.1 Ω, because of eight parallel current paths from the thin film to the anchor;

Series (stray) inductance is low, below 0.1 nH, because of eight parallel current paths from the thin film to the anchor;

Low control voltage level possible (3–5 V) because of the low film stress; and

Warping of the mechanically decoupled structure is small.

Removes almost all the stress issued to the suspended structure due to the thermal expansion mismatch.

Relaxes the built-in stress in the suspended structure.

Series resistance of the spring structure is smaller than in the previous spring structures.

Very rigid structure in other degrees of freedom. Rigid boundaries prevent warping and allow bigger capacitors to be made, than previous structures.

Eliminates the moment effect caused by thermal deformation of the thick anchoring.

BRIEF DESCRIPTION OF THE DRAWINGS

Next the invention will be described in greater detail with reference to exemplary embodiments in accordance with the accompanying drawings, in which FIG. 12B illustrates cross sections of a production sample after phases 1250–1270 in an examplary process to produce a structure according to the invention.

DETAILED DESCRIPTION

Figure 1:
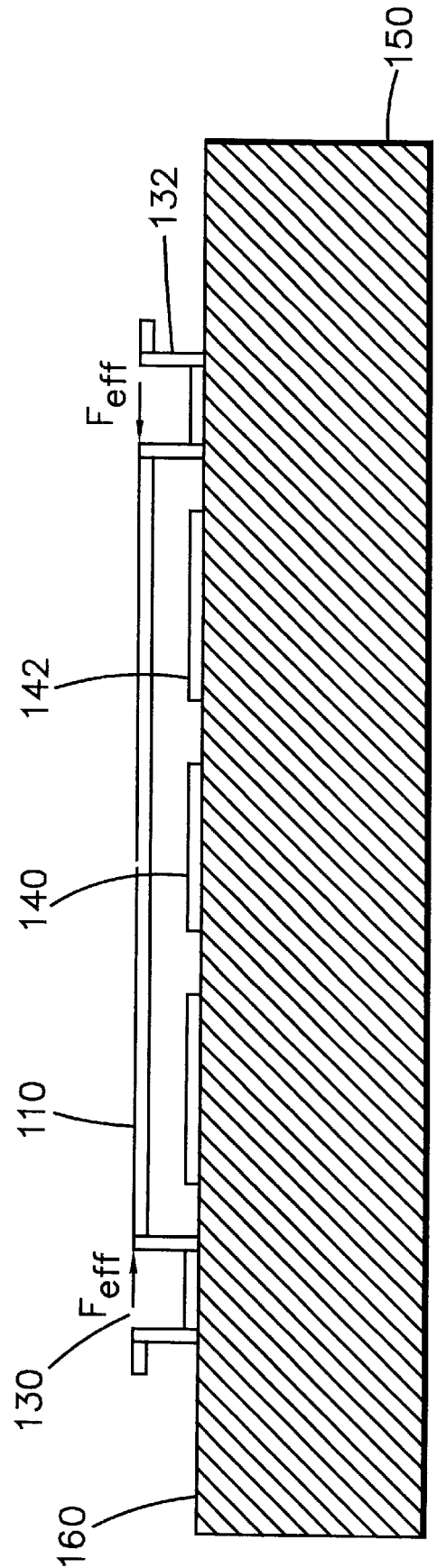
FIG. 1 illustrates a prior art micromechanical bridge.
Figure 2:
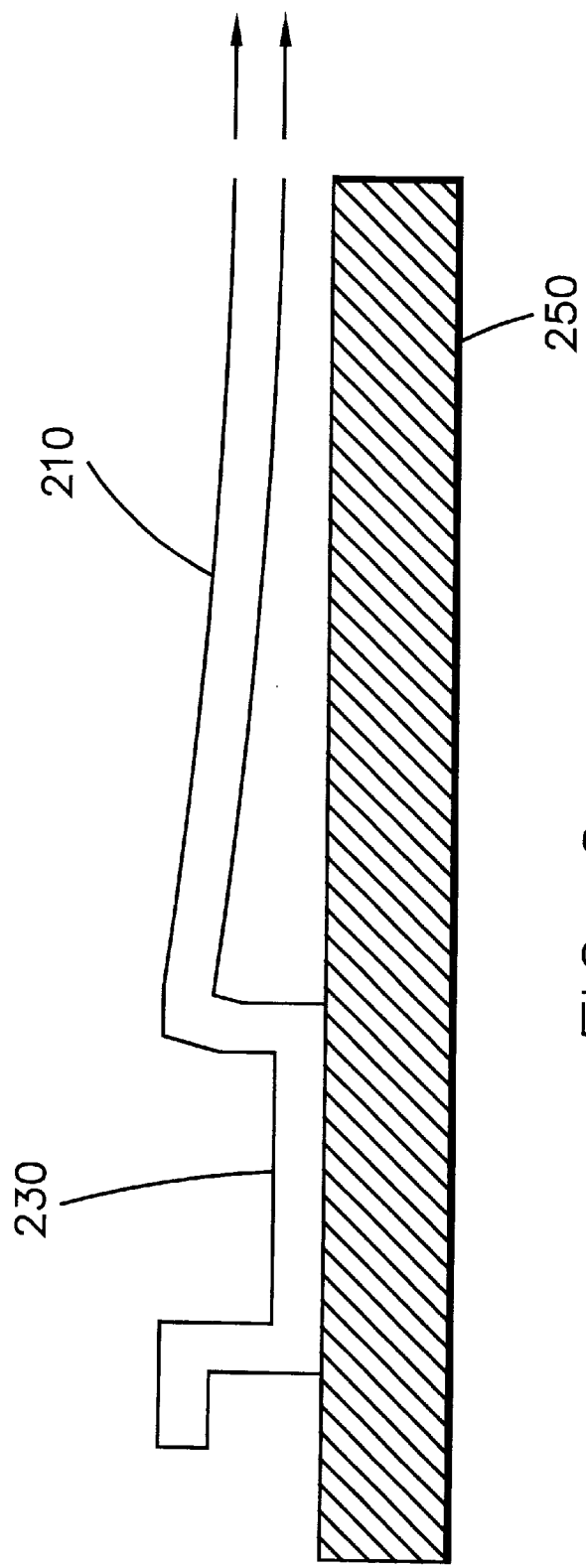
FIG. 2 illustrates a moment effect in an anchor of a prior art micromechanical bridge.
Figure 3:
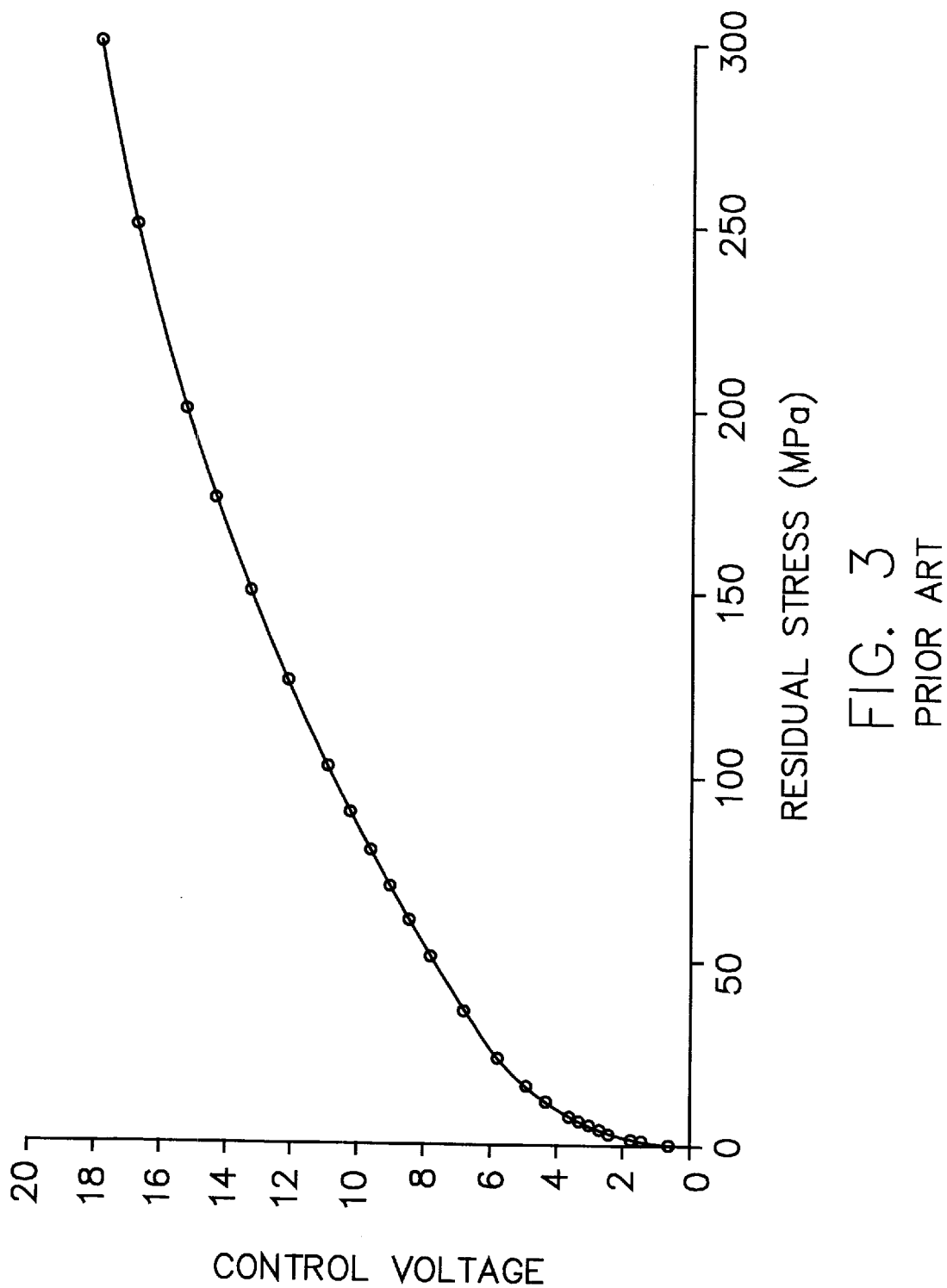
FIG. 3 illustrates dependence of pull-in voltage as a function of residual stress of a bridge in a prior art microelectromechanical capacitor.

FIGS. 1–3 were explained above in describing the prior art.

Figure 4A:
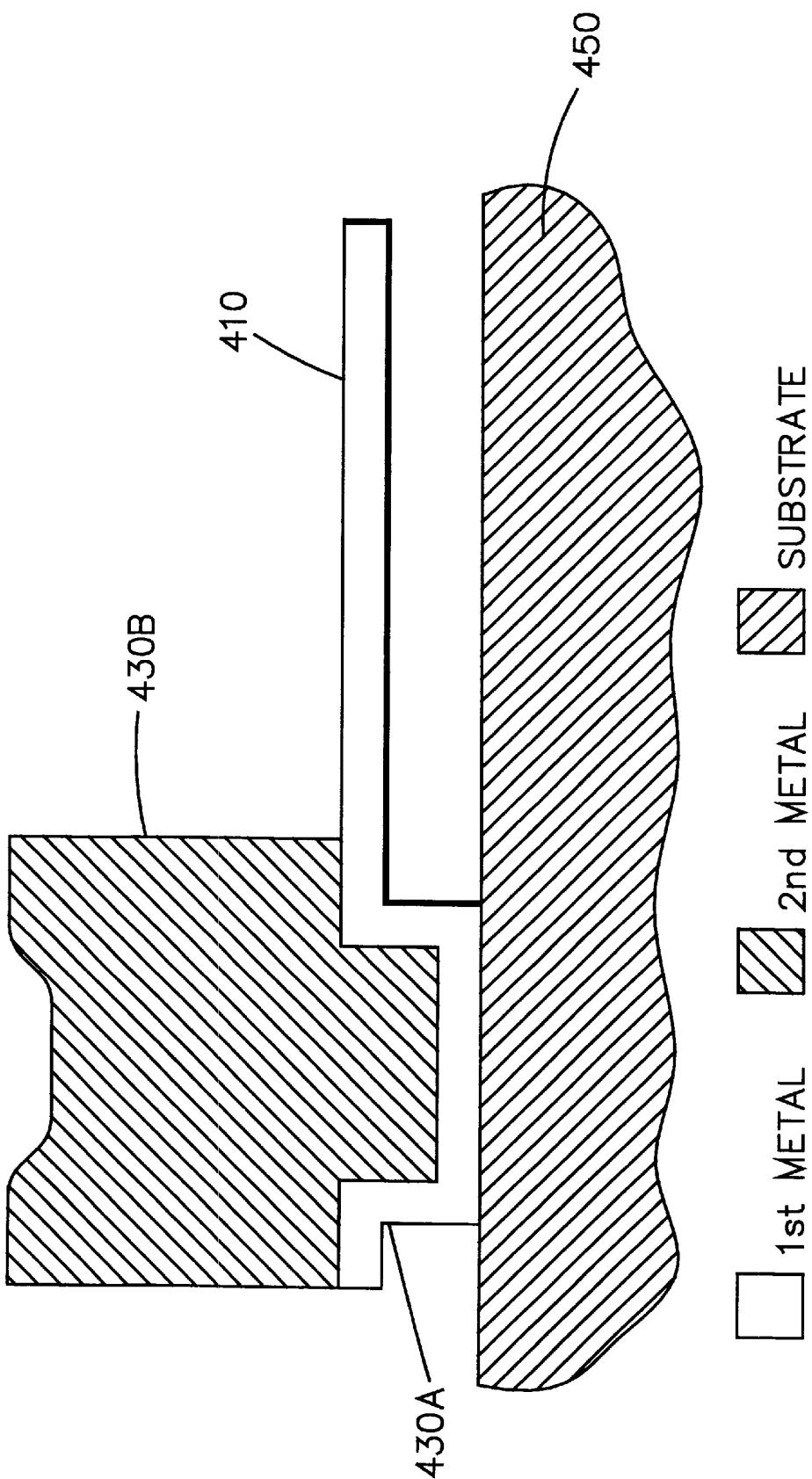
FIG. 4A illustrates an example of an anchor according to the invention.

FIG. 4A illustrates a cross section of an examplary anchor according to the invention. A thick second layer 430B is deposited over the area 430A that forms the anchoring of the suspended structure 410. This second layer will eliminate distortion effects on the suspended structure due to bending of the step up anchor structure, and the second layer also reduces the series resistance of the device if it is made of conductive material. The second layer is preferably a metal layer, but it may also be made of other material.

Figure 4B:
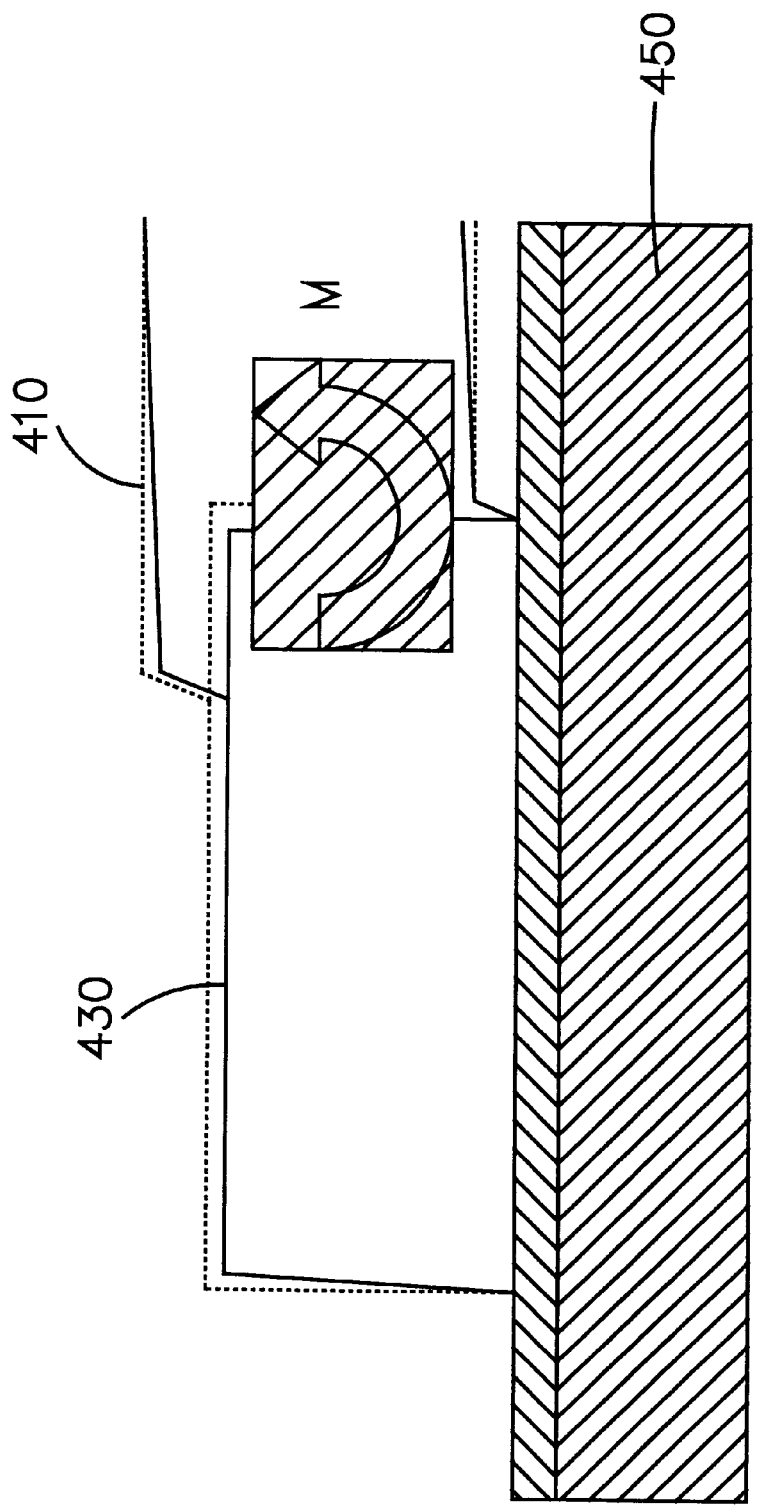
FIG. 4B illustrates deformation of a thick anchoring.

When micromechanical anchoring structure is thick, there is significant deformation of the anchoring structure due to the thermal expansion of the diaphragm 410. This is illustrated in FIG. 4B. Figure shows that when the anchoring 430 is fixed to the substrate 450, its bottom cannot chance its size with temperature. However, the upper part of the thick anchoring structure may chance its size with temperature. This creates a momentum M to the suspended structure that causes temperature dependence in the device behavior.

Figure 4C:
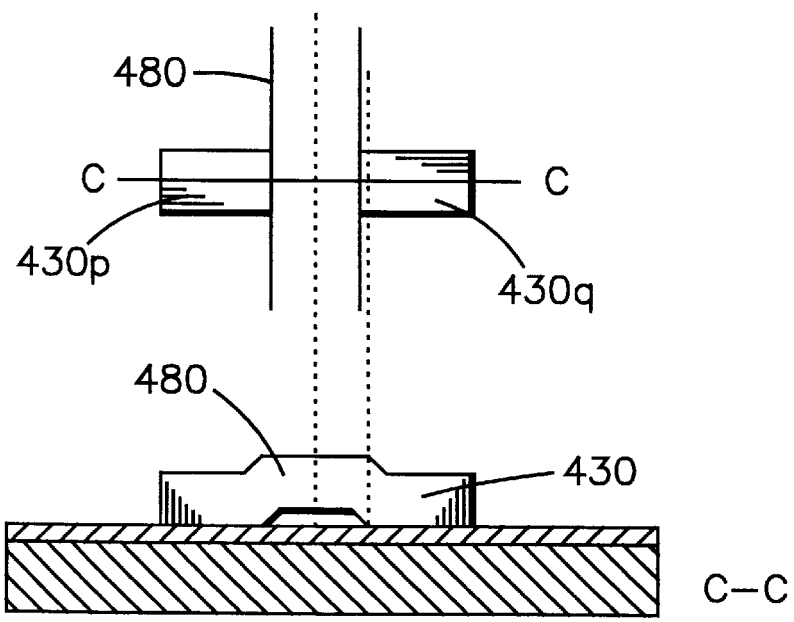
FIG. 4C illustrates an example of symmetric anchoring according to the invention that eliminates the effect caused by the deformation of thick anchoring.
Figure 4D:
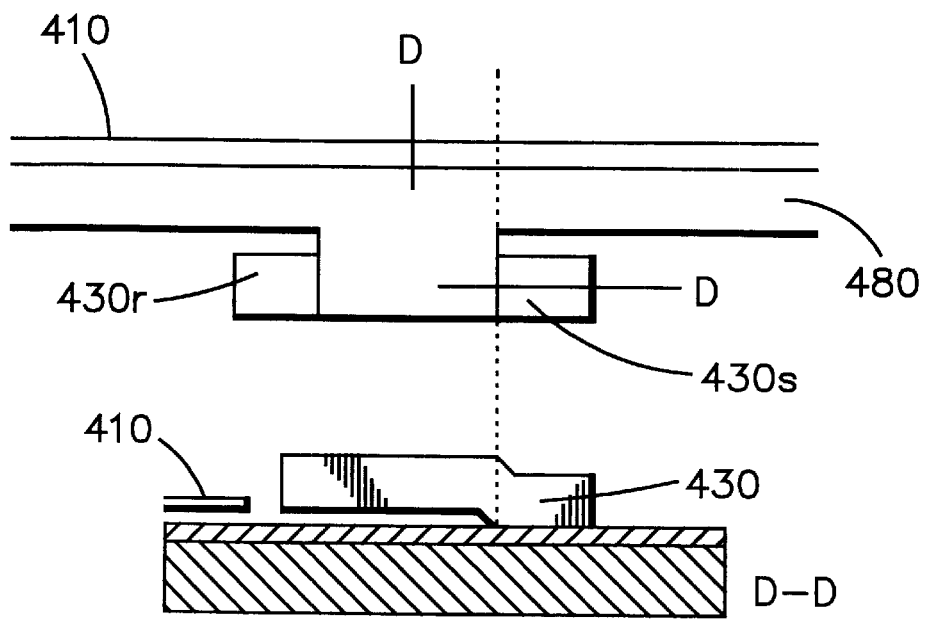
FIG. 4D illustrates another example of symmetric anchoring according to the invention that eliminates the effect caused by the deformation of thick anchoring.

FIGS. 4C and 4D illustrate top views and cross section views of two anchoring solutions that eliminate this effect. The solutions are based on an anchoring structure with two fixing points that are symmetrically connected to the substrate so that the moments from both fixing points cancel each other. In the solution of FIG. 4C there are two fixing points 430p and 430q that are placed symmetrically around a section of the frame 480 so that the moment caused by one of the first fixing point 430p is cancelled by the moment caused by the second fixing point 430q. In the solution of FIG. 4D there are also two fixing points 430r and 430s that are placed symmetrically around a projecting part 481 in a section of the frame 480 so that the moment caused by one of the first fixing point 430r is cancelled by the moment caused by the second fixing point 430s.

Figure 5:
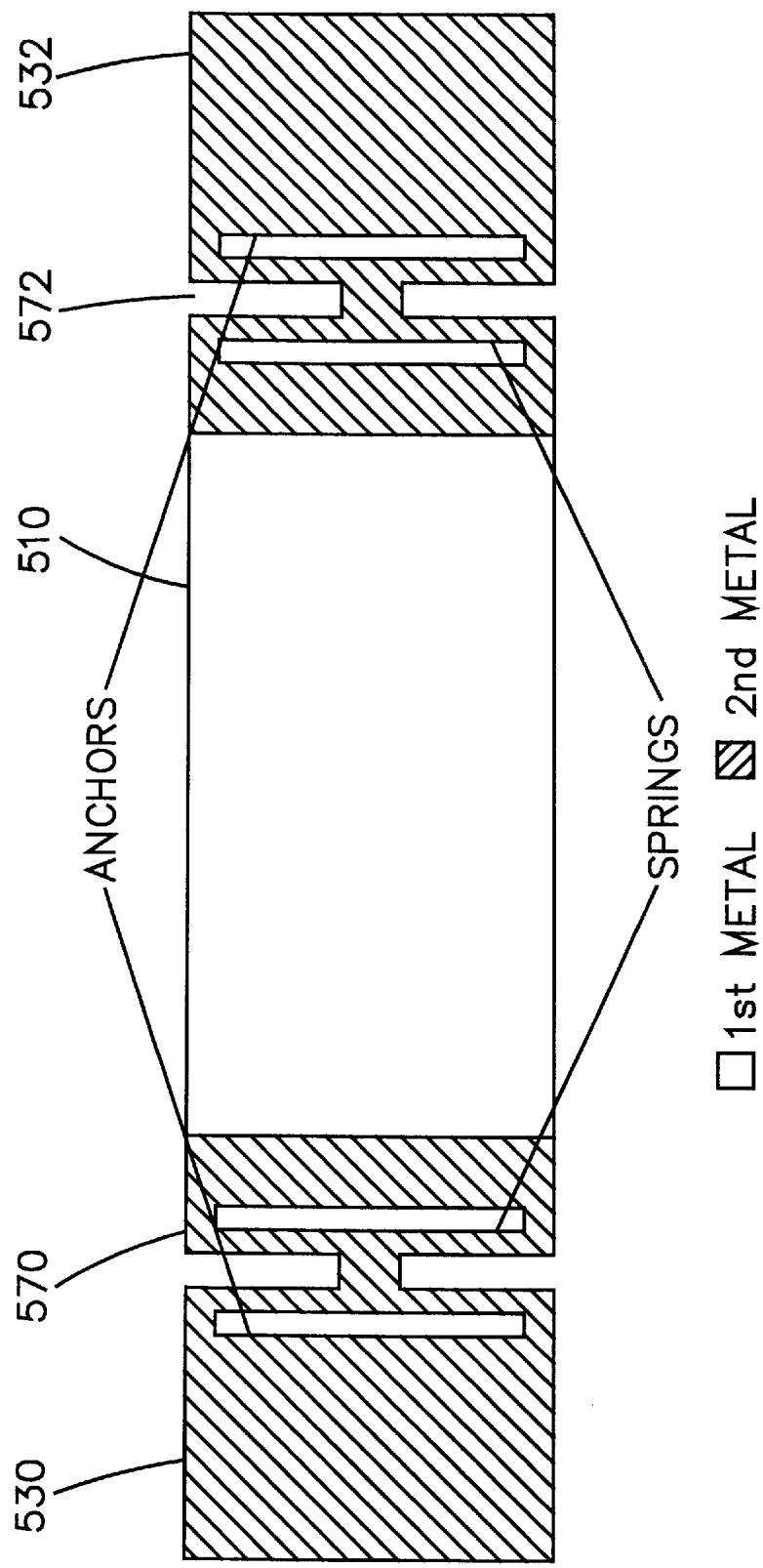
FIG. 5 illustrates an example of a micromechanical bridge according to the invention.

FIG. 5 illustrates an example of a micromechanical bridge according to the invention. The bridge comprises a spring structure 570, 572 between the suspended structure 510 and anchors 530 and 532. The spring structure relieves the stress that is caused by the thermal expansion mismatch between the substrate and the suspended structure. In addition, the spring structure releases the built-in stress that is formed to the suspended structure during the manufacturing.

Figure 6:
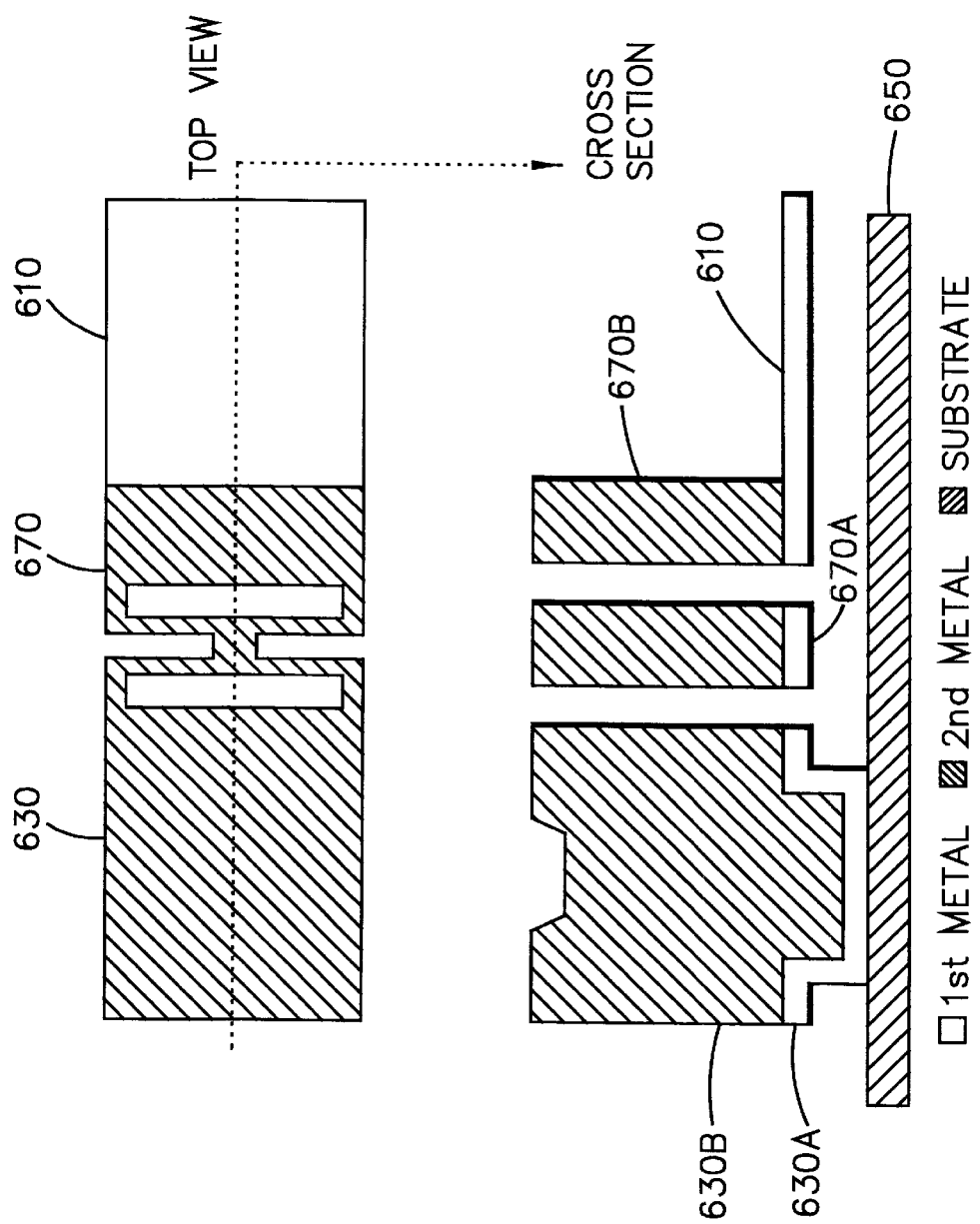
FIG. 6 illustrates a cross section of spring and anchor elements in an examplary michromechanical bridge according to the invention.

FIG. 6 illustrates a cross section of spring and anchor elements in an examplary michromechanical bridge according to the invention. The anchor 630 consists of a first metal layer 630A and a second metal layer 630B. The reinforced structure is also used in the spring element 670 which thus consists of a first metal layer 670A and a second metal layer 670B. FIG. 6 also shows the suspended structure 610 and the substrate 650.

Figure 7:
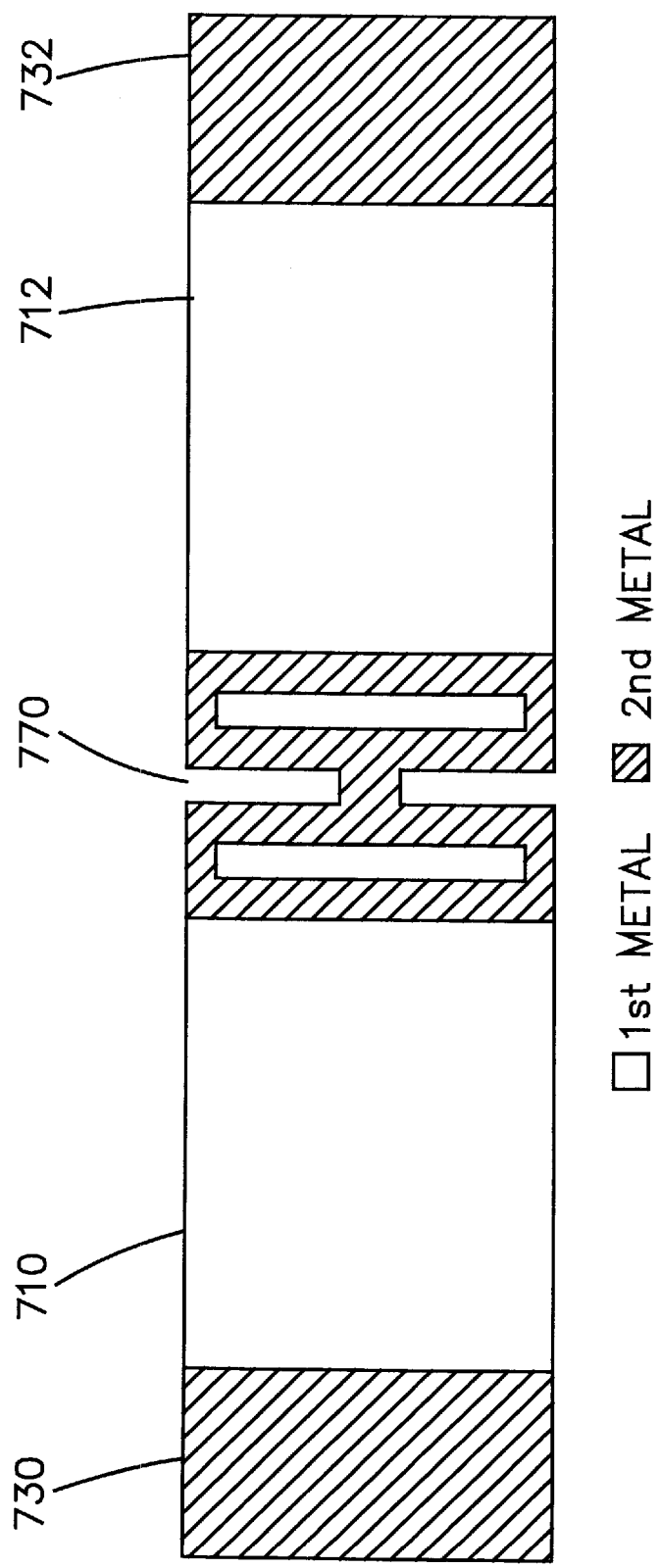
FIG. 7 illustrates an example of a micromechanical bridge according to the invention comprising one spring element.

There are several implementations for the spring structure when applied in tunable capacitors. A first implementation was illustrated in FIGS. 4 and 5 wherein a spring structure is used in both ends of the beam to lower the temperature dependency, without substantially increasing the series resistance. FIG. 7 shows a second implementation, where a single forced spring 770 is located in the center of the beam and divides the beam into two parts 710 and 712. The anchors 730 and 732 are coupled directly to the the two parts 710, 712 of the beam.

Figure 8:
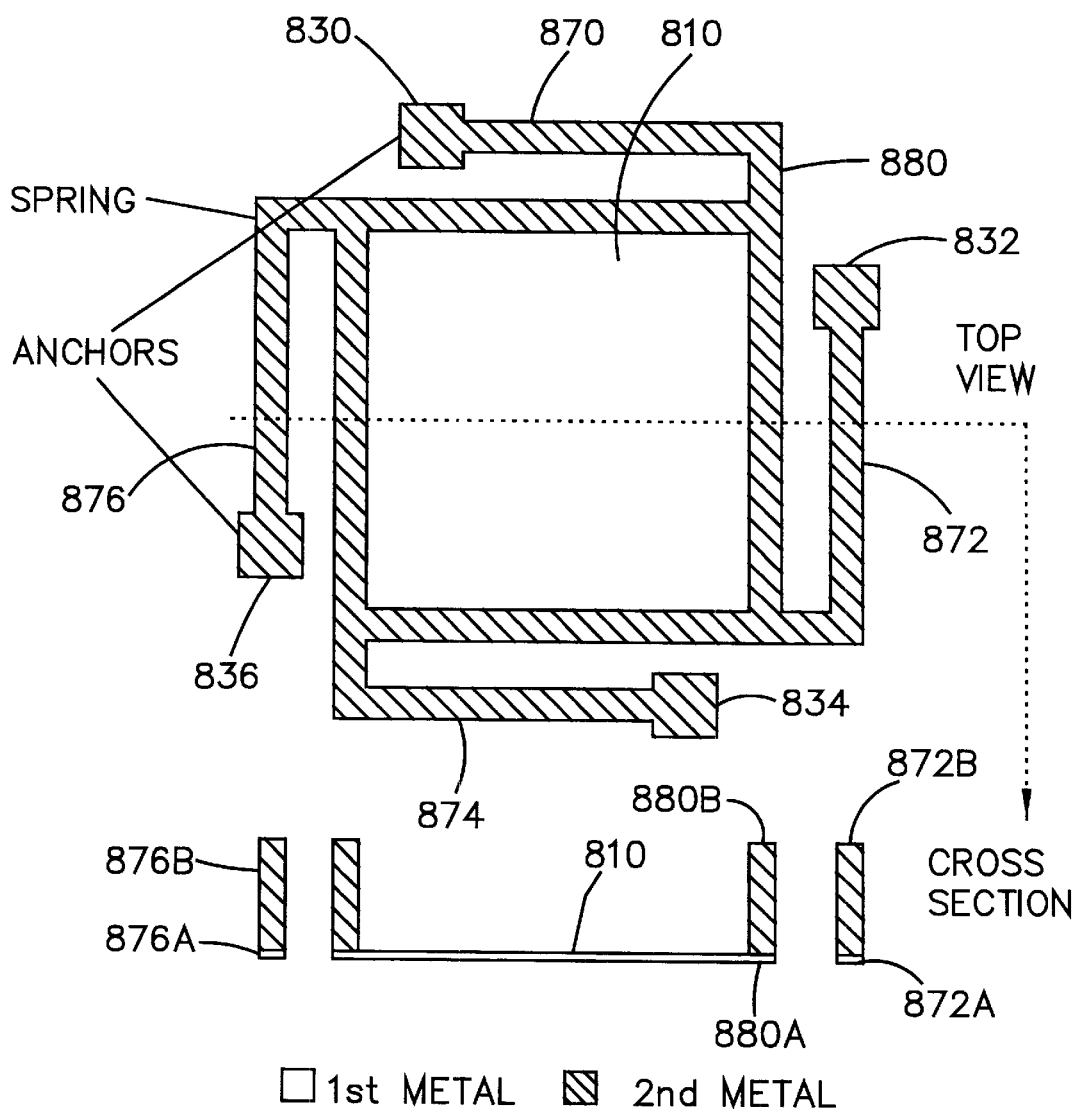
FIG. 8 illustrates an example of a coupling structure of a square electrode plate according to the invention.

FIG. 8 illustrates an examplary coupling structure of a square electrode plate according to the invention. In this embodiment the second metal layer forms a reinforced frame, 880, 880A, 880B, that provides firm boundary conditions for the movable electrode 810, thus preventing warping of the diaphragm capacitor structure. Warping tends to limit the size of the thin film capacitor, so the fir boundary conditions due to the second metallisation layer allow realization of much bigger structures and in addition lower the series resistance. The frame 880 is coupled with four springs 870, 872, 874 and 876 to anchors 830, 832, 834 and 836. Both the anchors and the springs have a reinforced structure (872A, 872B, 876A, 876B).

Figure 9A:
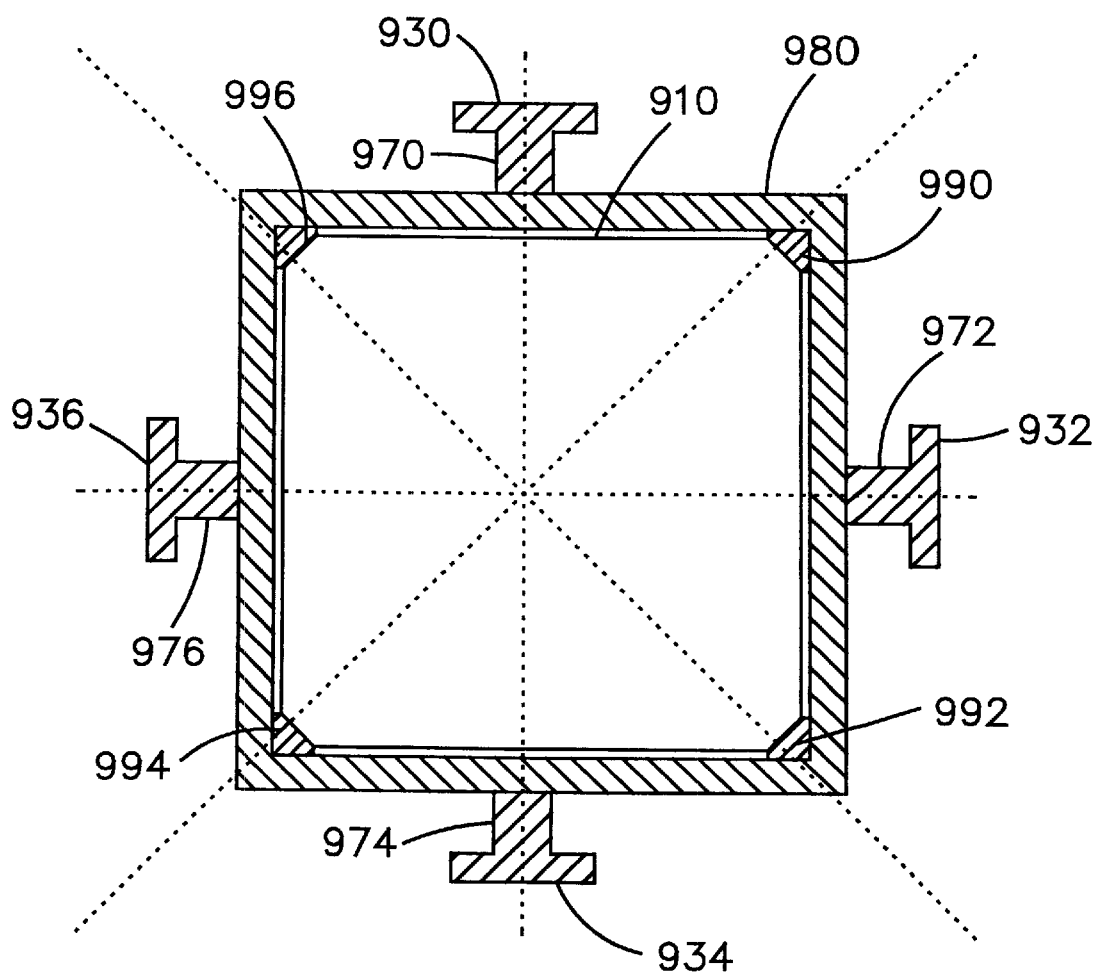
FIG. 9A illustrates a preferable coupling structure of a rectangular diaphragm according to the invention.

FIG. 9A illustrates a preferable coupling structure using a frame for a rectangular electrode plate, in accordance with the invention. In this embodiment the second metal layer forms a reinforced frame, 980, which is coupled to the movable thin film 910 from corners with inner springs 990, 992, 994 and 996, thus preventing warping of the thin film capacitor structure. The frame is coupled to the substrate with four anchors 930, 932, 934 and 936 that are coupled to the frame with outer beams 970, 972, 974 and 976 that also serve as springs. The anchors and the springs may also have a reinforced structure.

Figure 9B:
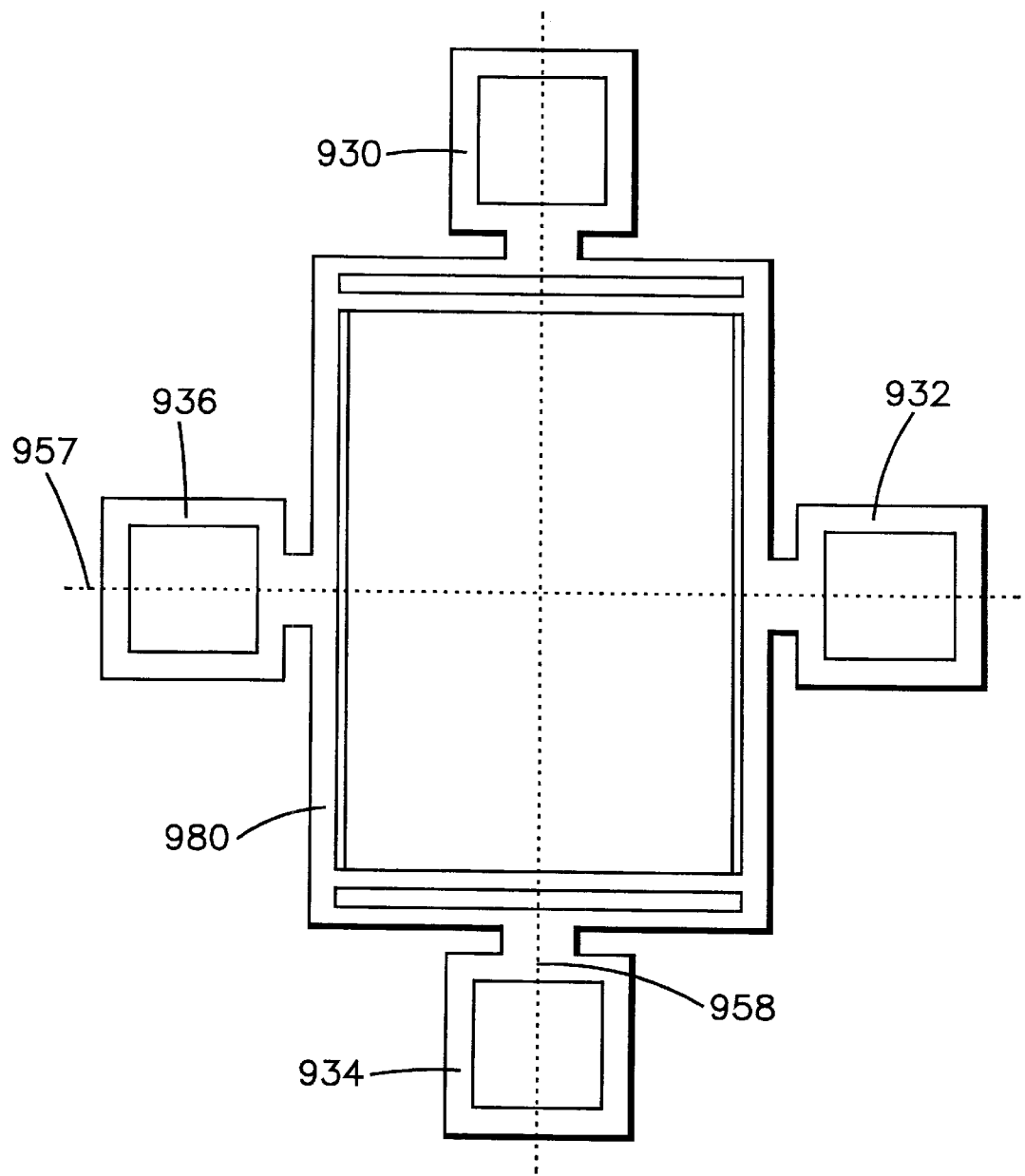
FIG. 9B illustrates a diaphragm suspended by an anchored frame.
Figure 9C:
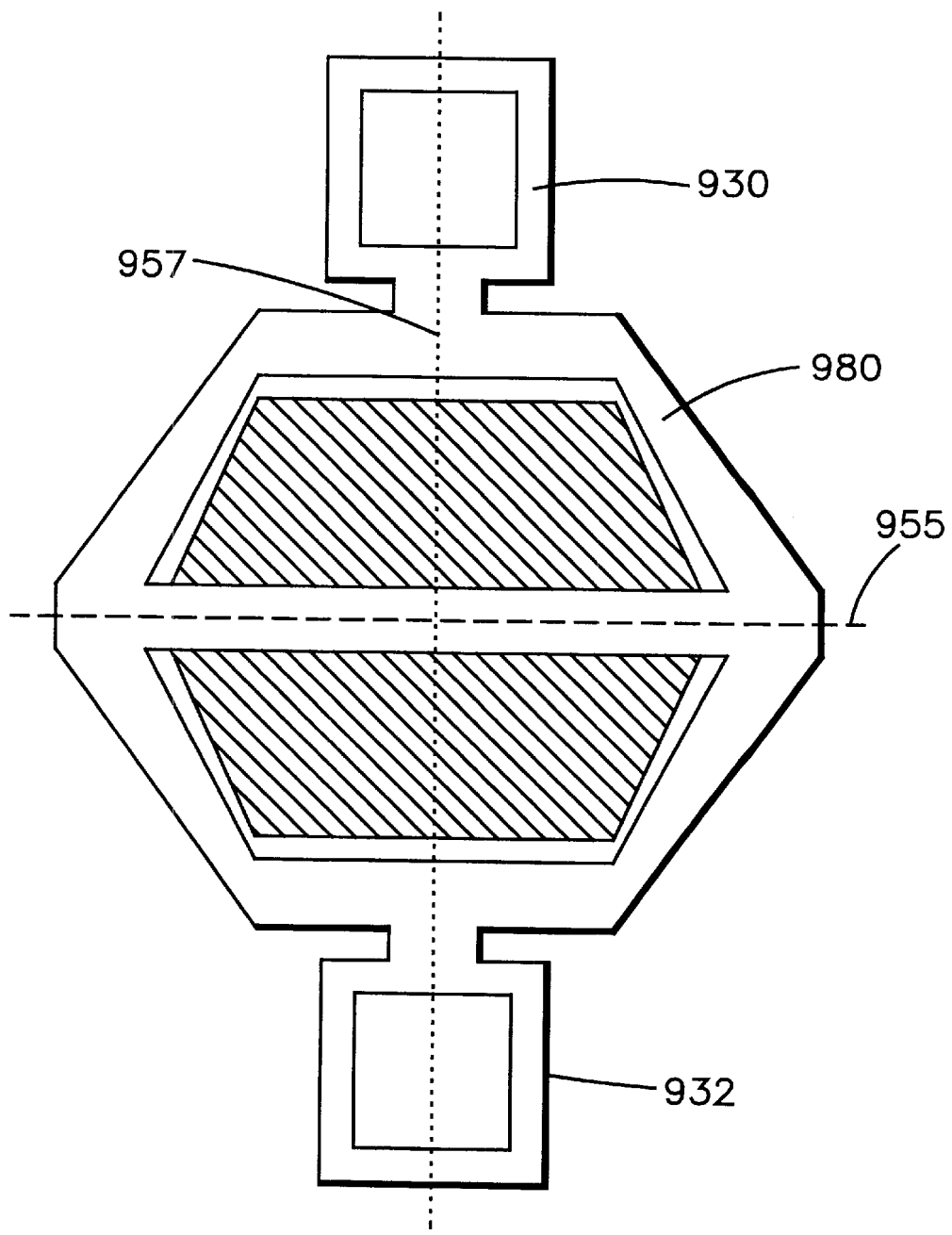
FIG. 9C illustrates a symmetrical frame anchored by two anchors.

FIGS. 9B and 9C show other possible geometries for an arrangement with a frame.

Figure 9D:
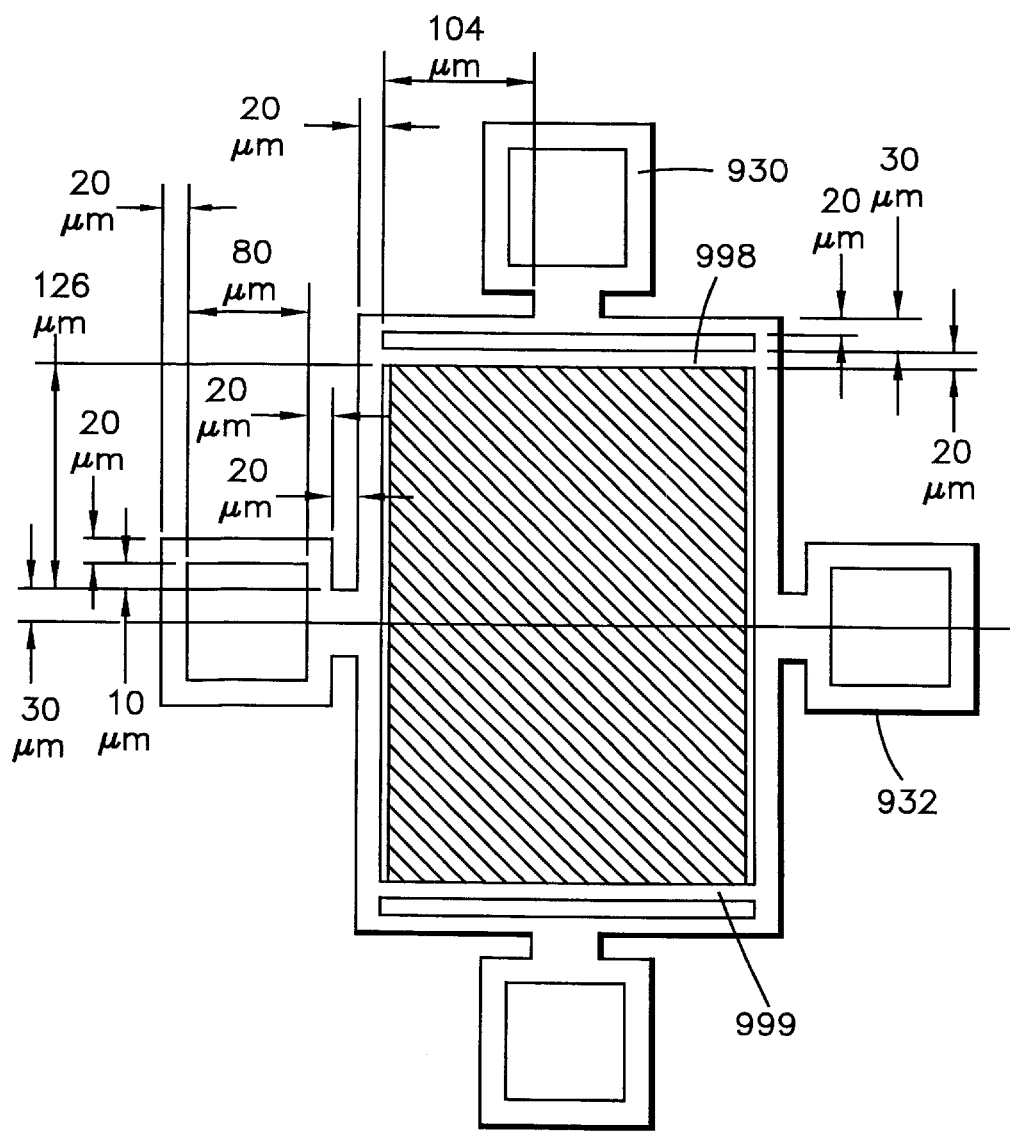
FIG. 9D illustrates typical dimensions of the coupling structure of FIG. 9B.

FIG. 9C illustrates an embodiment of a frame 980 symmetric along the axis 957 between two anchoring points 930 and 932, to which the frame is flexibly attached. A transversal beam 955 is arranged to make the frame rigid in absence of further anchoring points. The diaphragm 910 is attached to this rigid frame. FIG. 9D shows typical dimensions of the sturcture that is illustrated in FIG. 9B. The typical dimensions shown in the Figure are in micrometers. The framework around the thin film that compensates the thermal stresses is typically about 20 $\mu$m wide and 10 $\mu$m thick. The frame is stiff enough to prevent warping of the structure. When the thin film in the center acts as tunable capacitor, its typical thickness is 1 $\mu$m. A typical size of the thin film side is 50–500 $\mu$m. FIG. 9D also illustrates how outer beams 998, 999 are used in order to decouple any length expansion of the diaphragm from reaching the substrate via the anchors 930 and 932.

The embodiments of FIGS. 9A–9B have the following preferable features:

a) The thin film 910 is rectangular, preferably square;
b) The surrounding frame 980 is of a continuous, rectangular (square) structure;
c) Inner springs 990, 992, 994 and 996 connect the thin film to the frame at the corners of the frame;
d) The frame 980 is anchored to the substrate at the middle of the frame forming beams;
e) The structure may have optional outer beams that further connect the frame and the substrate anchoring.

The structure is preferably symmetrical. The anchoring of the frame to the substrate and the attachment of the thin film to the frame are preferably at 45 degree angle of each other. Mechanical decoupling of the diaphragm from the substrate achieved by the structure is at an optimum.

Measurements show that the structure according to FIG. 9A almost totally prevents changes of stress in the thin film due to temperature changes. The frame around the thin film deforms under the thermal stress, but the thin film remains mostly intact. In a case where a conventional bridge structure would have a thermal stress of 100 MPa induced in the suspended thin film, the structure of FIG. 9A was measured to have a thermal stress of less than 0,5 MPa in the thin film. In this measurement the temperature change was 50 degrees C, which is possible in the enviroment of mobile devices.

Figure 9E:
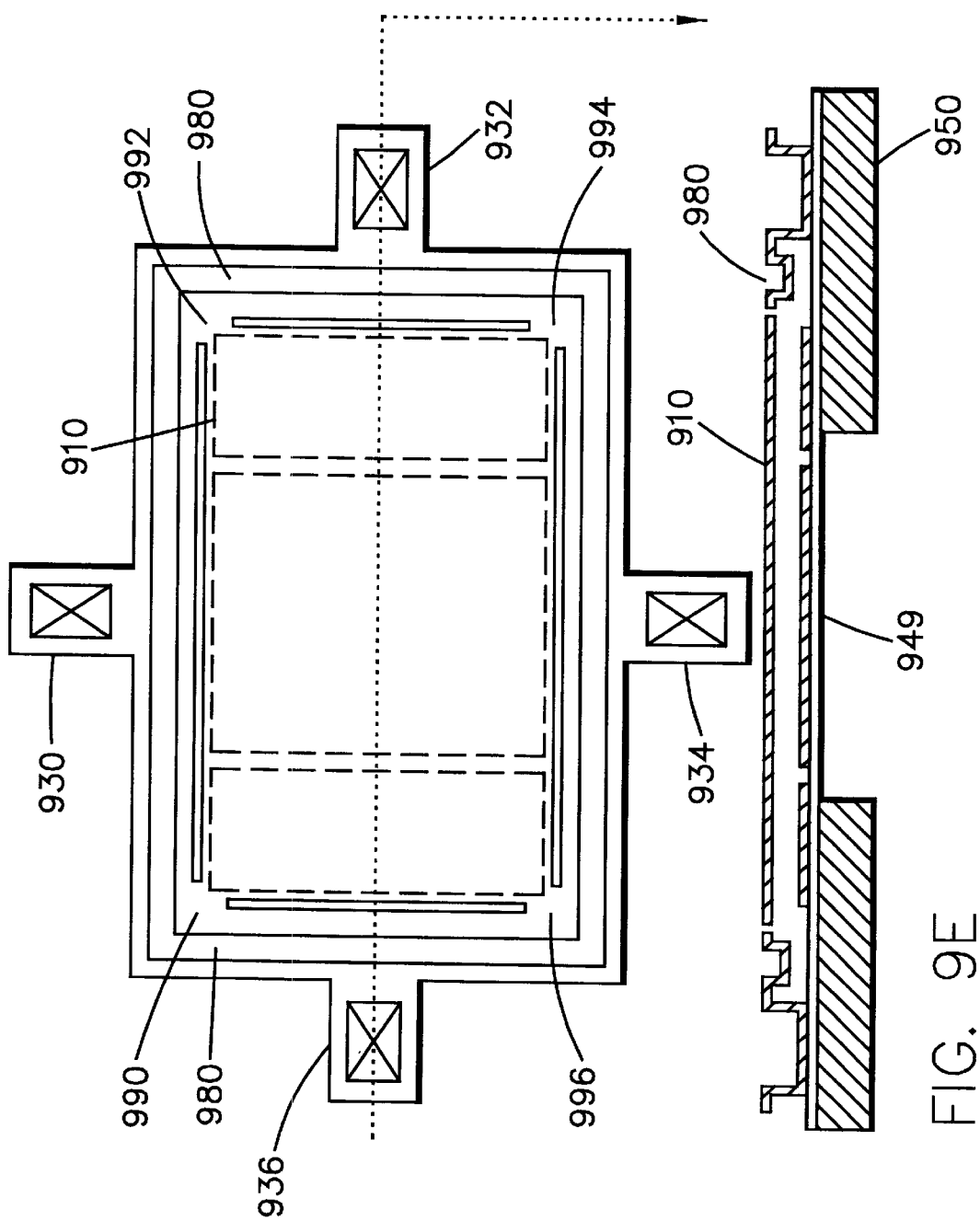
FIG. 9E illustrates a simplified top and cross-sectional view of a bridge capacitor having frame beams reinforced with profile geometry.

The frame can be reinforced against the movement in the direction of the characteristic movement of the thin film, as shown above, by producing the whole frame thick in this direction by using thicker material in the frame. However, another way of reinforcing the frame is to use a profile geometry for the cross section of the frame. The geometry of the beams may may have the shape of eg. "U" "T" profile. FIG. 9E shows a simplified top view and cross section view of a bridge capacitor that is surrounded with a frame 980 which is reinforced with profile geometry. This reinforcement may be used not only in the embodiments using a frame such as the examples of FIGS. 9A-9D, but also in other embodiments such as the ones illustrated in FIGS. 5–7.

Figure 9F:
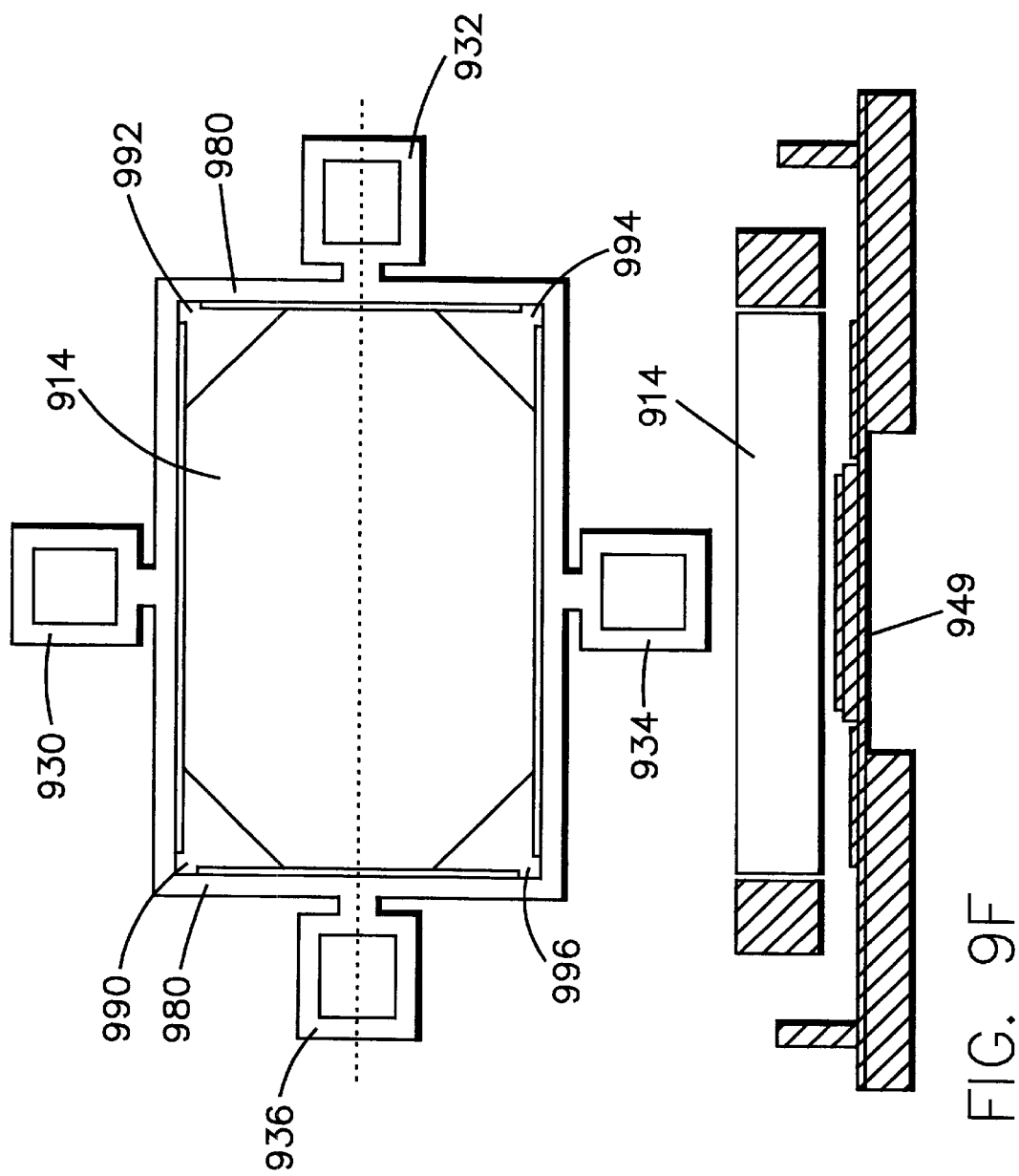
FIG. 9F illustrates an acceleration sensor with a temperature compesation structure according to the invention.

FIG. 9F shows how the acceleration sensor with inertial mass 914 can be implemeted using invented temperature compensation structure. According to the theory the most accurate method to measure the displacement in the capacitive structure is to tune the capacitive sensor by an inductor. The improvement of the resolution of the capacitive sensor in tuning it by an inductor is inversely proportional to the Q value of the tuned circuit. The conclusion is that the rf measurement principle improves the measurement resolution only if the Q value of the tuning circuit is relatively high, i.e., Q >100. The state of the art micromechanical accelerometers have large series resistance and thus low Q value. Accelerometer according to the present invention using 400×400 $\mu$m$^2$ plate with thickness of 12 $\mu$m, enables an accelerometer with 10$^{-2}$ $\mu$m/g sensitivity that is optimal for 50 g measurement range.

Figure 10:
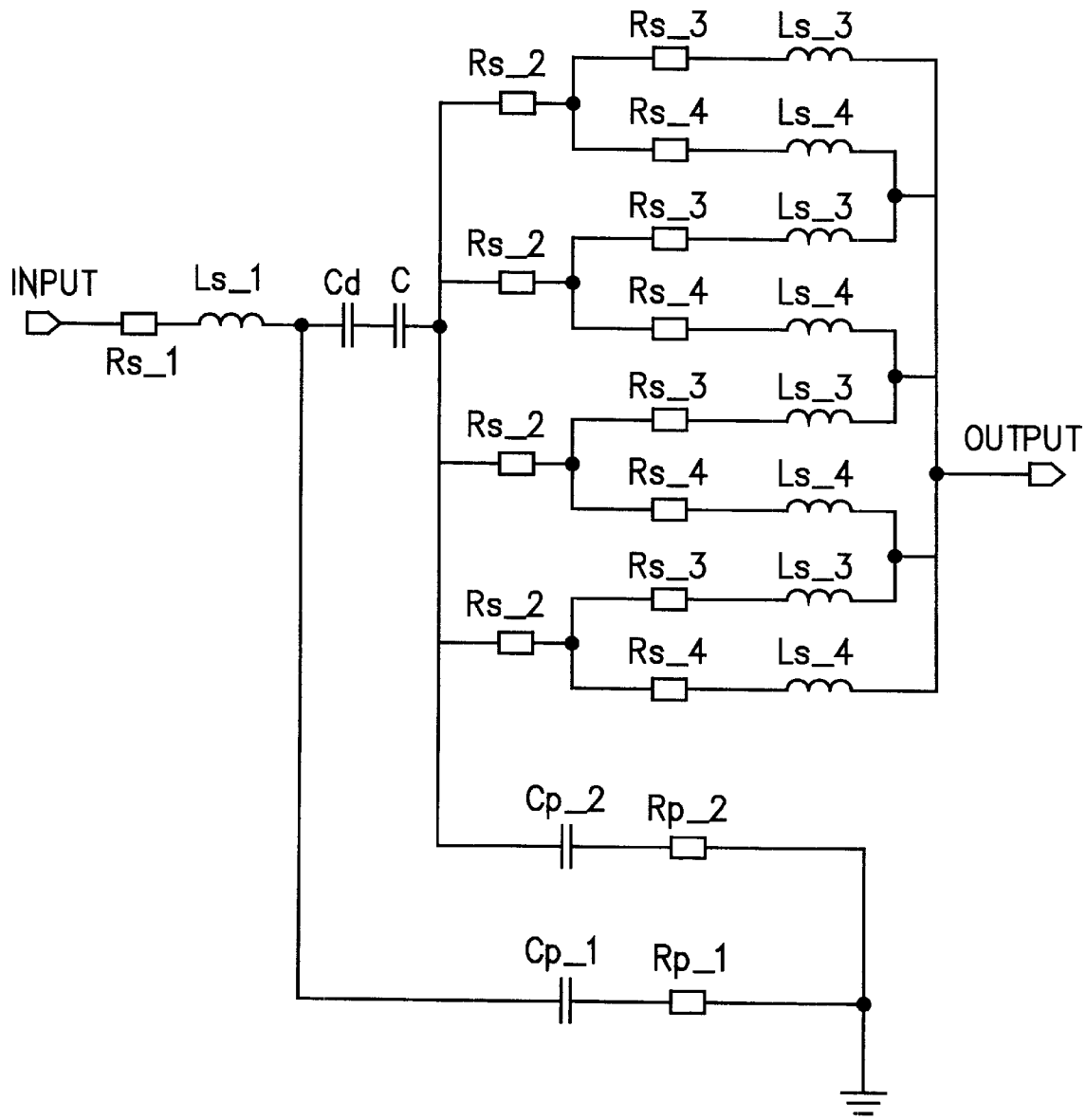
FIG. 10 illustrates ac electrical equivalent circuit of a micromechanical capacitor.

FIG. 10 illustrates an electrical equivalent circuit of the tunable capacitor that is shown in FIG. 9A. The citations as well as some typical values for the electrical parameters of the structure of FIG. 9A are listed in Table 1.

TABLE 1

Parameters in the electrical equivalent circuit of FIG. 10.

| Parameter | Description | Value |
|---|---|---|
| C | Capacitance in the air gap (1 $\mu$m thick) | 1.0 pF |
| Cd | Capacitance in the dielectric layer (100 nm thick) | 44 pF |
| Rs_1 | Resistance in the lower electrode (1 $\mu$m thick) | 0.05 $\Omega$ |
| Ls_1 | Inductance in the lower electrode (1 $\mu$m thick) | 0.05 nH |
| Rs_2 | Resistance in the upper electrode (0.5 $\mu$m thick) | 0.1 $\Omega$ |
| Ls_2 | Inductance in the upper electrode (0.5 $\mu$m thick) | 0.11 nH |
| Rs_3 | Resistance in the frame (10 $\mu$m thick) | 0.06 $\Omega$ |
| Ls_3 | Inductance in the frame (10 $\mu$m thick) | 0.18 nH |
| Rs_4 | Resistance in the frame (10 $\mu$m thick) | 0.03 $\Omega$ |
| Ls_4 | Inductance in the frame (10 $\mu$m thick) | 0.14 nH |
| Cp_1 | Parasitic capacitance to the substrate | 0.1–0.5 pF |
| Rp_1 | Resistance in the substrate | ~10 k$\Omega$ |
| Cp_2 | Parasitic capacitance to the bias electrode | 1 pF |
| Rp_2 | Impedance of the control circuit | >1 k$\Omega$ |

The values in the Table 1 show that the series resistance and inductance values are very small which makes the capacitor structure very suitable for high frequency applications.

Figure 11A:
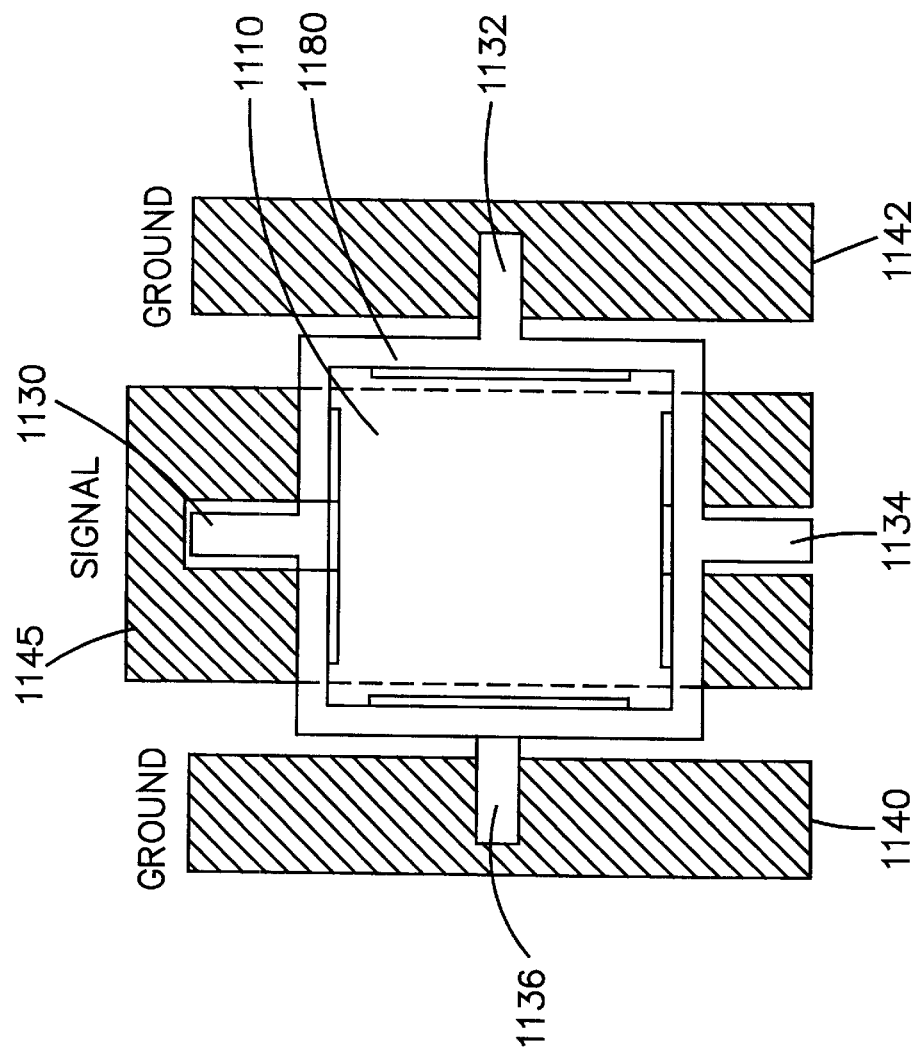
FIG. 11A illustrates a first embodiment of a coupling structure with a frame for a rectangular electrode plate, according to the invention.
Figure 11B:
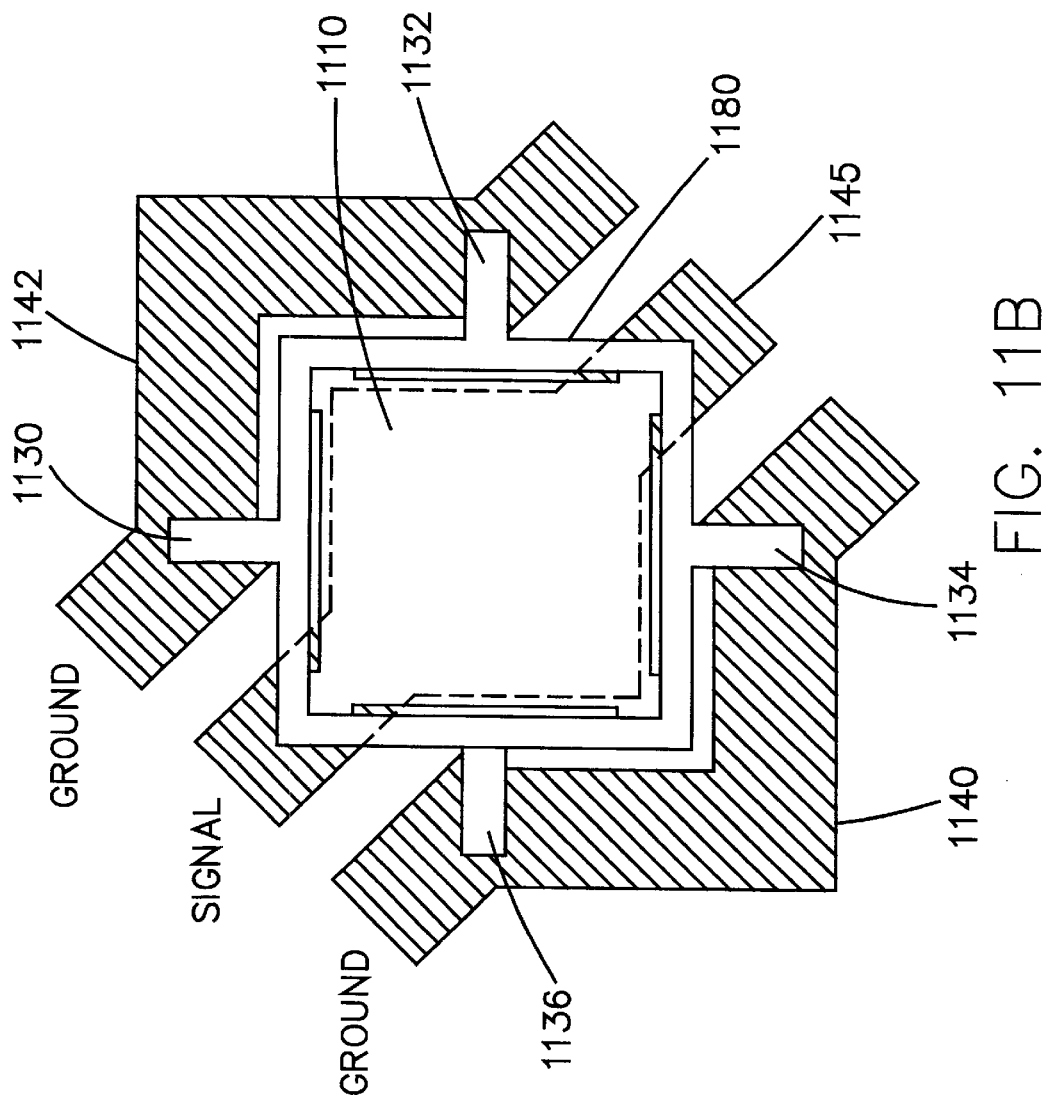
FIG. 11B illustrates a first embodiment of a coupling structure with a frame for a rectangular electrode plate, according to the invention.

FIGS. 11A–11D show four implementations of a tunable capacitor with a coupling frame, and how a tunable capacitor can be connected into a coplanar waveguide (CPW) line. In the embodiments of FIGS. 11A and 11B the frame 1180 is grounded to the ground lines 1140, 1142, from two attachment points 1132, 1136, and in the embodiments of FIGS. 11B and 11D the frame is grounded to the ground lines 1140, 1142, from all four attachment points 1130, 1132, 1134, 1136. The thin film 1110 is connected to the frame 1180 from all corners both mechanically and electrically.

Figure 11C:
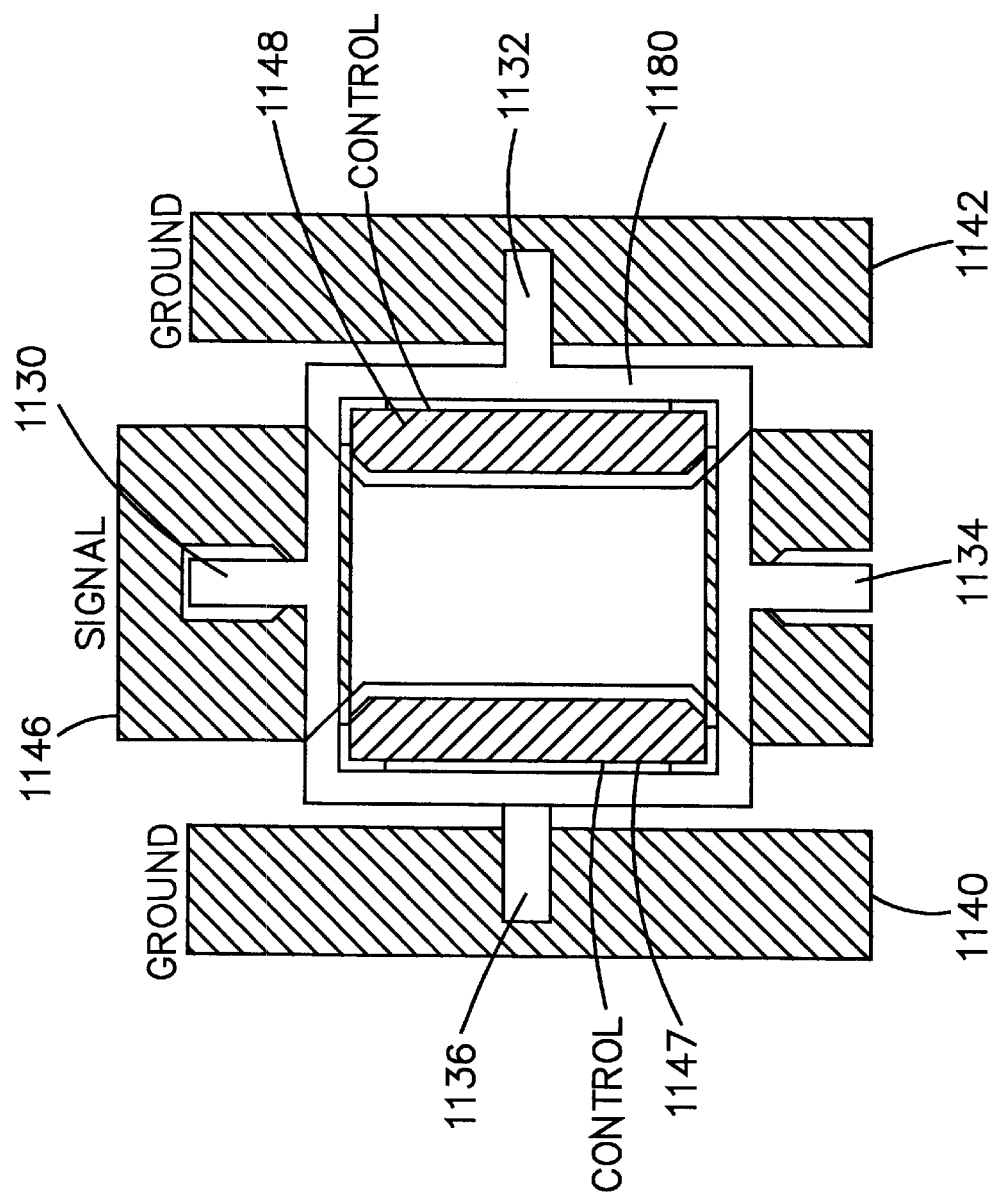
FIG. 11C illustrates a first embodiment of a coupling structure with a frame for a rectangular electrode plate, according to the invention.
Figure 11D:
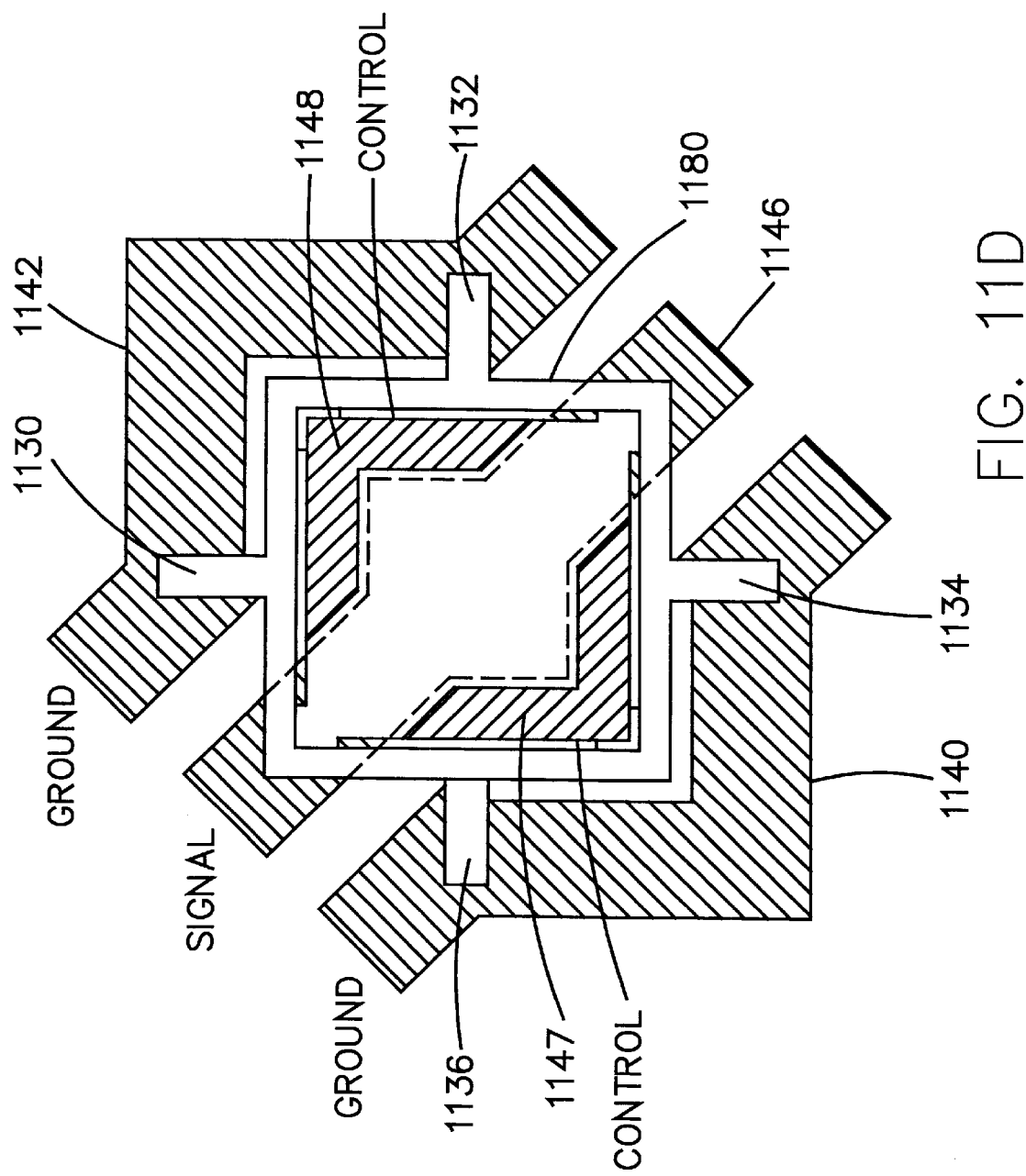
FIG. 11D illustrates a first embodiment of a coupling structure with a frame for a rectangular electrode plate, according to the invention.

In the embodiments of FIGS. 11A and 11B the signal electrode 1145 is used also as a control electrode, but in the embodiments of FIGS. 11C and 11D comprise a separate signal electrode 1146, and the capacitance is controlled with separate control electrodes 1147, 1148. In FIGS. 11C and 11D the signal and control electrodes under the thin film 1110 are also shown; the thin film itself can be similar in all four embodiments.

In the embodiments of FIGS. 11A–11D the movable thin film is grounded, and the "hot" signal and control electrodes are fixed on the substrate, which is more convinient for providing the electrical connections to the thin film. This way the parasitic capacitance between the hot electrode of the capacitor and the substrate ground potential can also be minimized. However, it is also possible to use the movable thin film as a hot electrode, and use the fixed electrode of the substrate as a ground electrode.

Figure 12A:
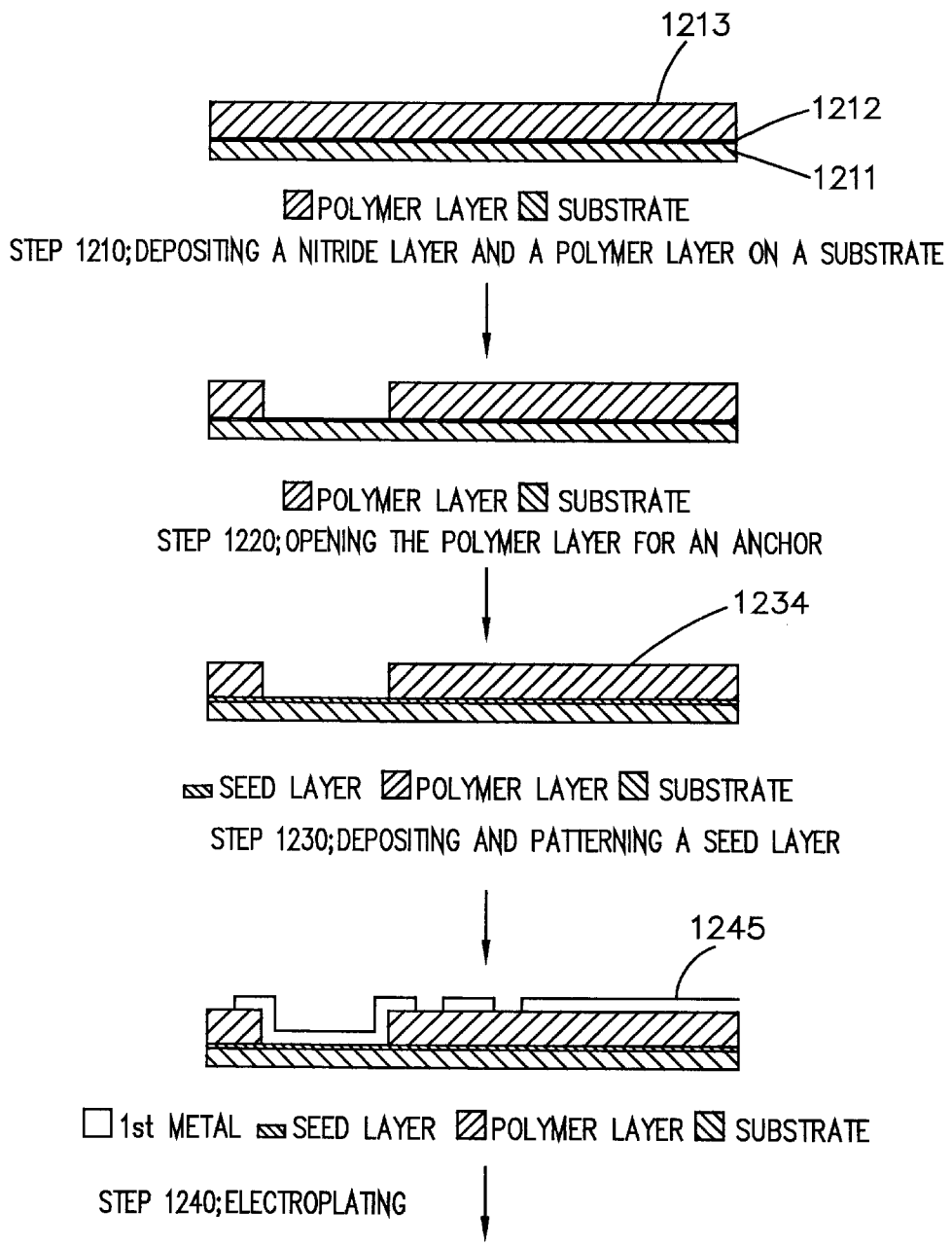
FIG. 12A illustrates cross sections of a production sample after phases 1210–1240 in an examplary process to produce a structure according to the invention.

FIGS. 12A and 12B describe phases of a typical process to make the invented structure. Protective nitride layer 1212 is first grown first on the substrate 1211 and a polymer layer 1213 is deposited on the nitride layer, step 1210. Polymer can be deposited for instance by spinning. On the next phase 1220 the first lithography is performed, and the anchor opening is patterned on the polymer. This is followed by the step 1230 of seed layer 1234 deposition and patterning of the seed layer and followed by the step 1240 of electroplating. The first electroplating creates a thin (eg. a thickness of 1 $\mu$m) metal layer 1245 over the polymer sacrificial layer.

A second polymer layer 1256 is then deposited on step 1250 and a third lithography step is used to partially remove the polymer. Now part of the first metal structure is visible and it is used as a seed layer for the second electroplating, step 1260. This electroplating forms the thick metal layer (eg. a thickness of 10 $\mu$m), 1267, which stabilizes the anchor and forms and reinforces the springs. In the last step 1278, sacrificial polymer is etched away, 1278, and the suspended structure is thus released.

The invention has been explained above with reference to the aforementioned embodiments, and several industrial advantages of the invention have been demonstrated. It is clear that the invention is not only restricted to these embodiments, but comprises all possible embodiments within the spirit and scope of the inventive thought and the following patent claims. For example, the inventive idea of the micromechanical arrangement is not restricted to be used in a tunable capacitor, but it can be applied also in many other components and purposes. One examplary application of the invention is an inertial sensor, such as an accelometer or an angular rate sensor where it is possible, with the present invention, to achieve a low series resistance and high Q value together with large inertial mass. The invention is not either restricted to use of the mentioned materials. For example, the reinforced structure may comprise thin film and/or electroplated metal, it may comprise polycrystalline silicon and/or monocrystalline silicon, or it may comprise insulating films.

CITED REFERENCES

[1] Y. Konaka and M. G. Allen, "Single- and multi-layer electroplated microaccelerometers", Digest of Tech. Papers, IEEE 1996.

[2] J. T. Ravnkilde, "Nickel surface micromachined accelerometers", Internal Report, MIC-DTU, August 1998.

[3] Dec A. and K. Suyama, Micromachined electromechanically tuneable capacitors and their applications to RF IC's, pp. 2587–2596, IEEE Transactions on Microwave Theory and Techniques, Vol. 46, No. 12, 1998.

[4] Gill J., L. Ngo, P. Nelson and C-J Kim, Elimination of extra spring effect at the step-up anchor of surface-micromachined structure, Journal of microelectromechanical systems, pp. 114–121, Vol. 7, No. 1, 1998.

[5] Nguyen C., L Katehi and G. Rebeiz, Micromachined devices for wireless communications, pp. 1756–1768, Proc. IEEE, Vol. 86, No. 8, 1998.

[6] D. J. Young, J. L. Tham, and B. E. Boser, A Micromachine-Based Low Phase-Noise GHz Voltage-Controlled Oscillator for Wireless Communications, Proc. of Transducers '99, Jun. 7–10, 1999, Sendai, Japan, pp. 1386–1389).

What is claimed is:

1. An arrangement for coupling a movable element, which has a characteristic movement direction, to a fixed structure, such as a substrate, of a micromechanical component, characterized in that the arrangement comprises at least one coupling means for coupling the movable element to the fixed structure, and at least one flexible means for allowing different thermal expansion between the movable element and an other structure in a direction which is substantially perpendicular to the characteristic movement of the movable element, wherein said coupling means and/or flexible means is reinforced to be substantially inflexible in the direction of the characteristic movement of the movable element.

2. An arrangement according to claim 1, characterized in that said flexible means is located between said movable element and said coupling means.

3. An arrangement according to claim 1, characterized in that flexible means is located within said movable element.

4. An arrangement according to claim 1, characterized in that the flexible means comprises a frame which is connected to the movable element and to the coupling means for connecting the movable element flexibly to the coupling means.

5. An arrangement according to claim 1, characterized in that the reinforcing is achieved with an enlarged thickness of the material.

6. An arrangement according to claim 1, characterized in that the reinforcing is achieved with a profile geometry.

7. An arrangement according to claim 1, characterized in that the reinforced structure comprises thin film and/or electroplated metal.

8. An arrangement according to claim 1, characterized in that the reinforced structure comprises polycrystalline silicon and/or monocrystalline silicon.

9. An arrangement according to claim 1, characterized in that the reinforced structure comprises insulating film.

10. An arrangement according to claim 4, characterized in that the frame is attached to the movable element from an inside of the frame, and the frame is attached to the coupling means from an outside of the frame.

11. An arrangement according to claim 4, characterized in that the coupling means are connected to a fixed structure at least at two separate anchoring points symmetrically positioned around a part of said frame.

12. An arrangement according to claim 4, characterized in that the frame is attached to the movable element from corners of the frame, and the frame is attached to the coupling means from a middle of the frame forming frame beams.

13. An arrangement according to claim 1, characterized in that the movable element is a deflecting diaphragm.

14. An arrangement according to claim 1, characterized in that the movable element is an electrode of an adjustable capacitor.

15. An arrangement according to claim 1, characterized in that the movable element has enlarged thickness forming an inertial mass of an inertial sensor.

16. A micromechanical component including movable elements, the movable elements adapted to be coupled to other elements of micromechanical components, an arrangement for coupling the movable elements to the other elements comprising:

at least one coupling means for coupling a movable element to a fixed structure of another element; and at least one flexible means providing different thermal expansion between the moveable element and the fixed structure in a direction that is substantially perpendicular to a characteristic movement direction of the movable element, wherein the coupling means and/or flexible means is reinforced to be inflexible in a direction of the characteristic movement of the movable element.

* * * * *

UNITED STATES PATENT AND TRADEMARK OFFICE
CERTIFICATE OF CORRECTION

PATENT NO. : 6,557,413 B2
DATED : May 6, 2003
INVENTOR(S) : Nieminen et al.

It is certified that error appears in the above-identified patent and that said Letters Patent is hereby corrected as shown below:

<u>Title page</u>,
Item [30], Foreign Application Priority Data
  "Oct. 2, 2002 (FI) .................. 20002173"
should read
  -- Oct. 2, 2000 (FI) ……………... 20002173 --.

Signed and Sealed this

Twenty-sixth Day of August, 2003

JAMES E. ROGAN
*Director of the United States Patent and Trademark Office*